United States Patent
Koops

(10) Patent No.: US 8,648,319 B2
(45) Date of Patent: Feb. 11, 2014

(54) DEVICE FOR GENERATING THZ RADIATION WITH FREE ELECTRON BEAMS

(76) Inventor: Hans W. P. Koops, Ober-Ramstadt (DE)

( * ) Notice: Subject to any disclaimer, the term of this patent is extended or adjusted under 35 U.S.C. 154(b) by 0 days.

(21) Appl. No.: 13/812,213

(22) PCT Filed: Jul. 26, 2011

(86) PCT No.: PCT/EP2011/062803
§ 371 (c)(1),
(2), (4) Date: Feb. 22, 2013

(87) PCT Pub. No.: WO2012/013658
PCT Pub. Date: Feb. 2, 2012

(65) Prior Publication Data
US 2013/0264500 A1    Oct. 10, 2013

(30) Foreign Application Priority Data

Jul. 26, 2010    (EP) .................... 10170823

(51) Int. Cl.
H01S 5/183    (2006.01)
H01S 5/026    (2006.01)
H01S 3/00    (2006.01)
G02F 1/00    (2006.01)

(52) U.S. Cl.
USPC ............ 250/493.1; 250/492.24; 250/504 R; 315/505; 315/506; 315/507; 372/4; 372/50.1

(58) Field of Classification Search
USPC ............ 250/493.1, 494, 24, 504 R; 315/505, 315/506, 507; 372/4, 50.1
See application file for complete search history.

(56) References Cited

U.S. PATENT DOCUMENTS

| | | | | |
|---|---|---|---|---|
| 6,909,104 B1* | 6/2005 | Koops et al. | ............... | 250/493.1 |
| 7,649,328 B2* | 1/2010 | Smirnov et al. | ............... | 315/505 |
| 2010/0195675 A1* | 8/2010 | Moloney et al. | ................. | 372/4 |

FOREIGN PATENT DOCUMENTS

| | | |
|---|---|---|
| DE | 691304 C | 5/1940 |
| DE | 10241549 B4 | 7/2004 |
| DE | 10302794 A1 | 7/2004 |
| EP | 1186079 B1 | 2/2005 |
| FR | 581147 | 11/1924 |

OTHER PUBLICATIONS

Hartnagel et al., Ballistic Electron Wave Swing (BEWAS) to Generate THz-Signal Power, Frequenz, 2009, pp. 60-62,vol. 63, Issue 3-4.
Smith & Purcell, Visible Light From Localized Surface Charges Moving Across a Grating, Sep. 25, 1953, p. 1069, Phys. Ref. 92, Lyman Laboratory, Harvard University, Cambridge, Massachusetts.

(Continued)

Primary Examiner — Nikita Wells
(74) Attorney, Agent, or Firm — Woodling, Krost and Rust

(57) ABSTRACT

The invention relates to a device for generating electromagnetic THz radiation with free electron beams, comprising a dynatron tube, where the dynatron tube comprises an electron source, an extraction grid, and, an anode preferably coated with a material composition for high secondary electron emission, arranged in vacuum. The dynatron tube is connected to a voltage supply supplying an extractor voltage and an anode voltage and the extractor voltage is higher than the anode voltage. An oscillator modulates the anode voltage and the anode voltage is set to a work point voltage.

20 Claims, 9 Drawing Sheets

(56) References Cited

OTHER PUBLICATIONS

Walsh et al., Intensity of Smith-Purcell Radiation in the Relativistic Regime, Nuclear Instruments & Methods in Physics Research, Section A 341, 1994, pp. 277-279, Department of Physics and Astronomy, Dartmouth College, Hanover, New Hampshire.

Walsh et al., A New Far Infrared Free-Electron Laser, Nuclear Instruments & Methods in Physics Research, Section A 429, 1999, pp. 457-461, Department of Physics and Astronomy, Dartmouth College, Hanover, New Hampshire.

Goldstein et al, Demonstration of a Micro Far-Infrared Smith-Purcell Emitter, Applied Physics Letters, Jul. 28, 1997, pp. 451-454, vol. 71, No. 4, Department of Physics, Dartmouth College, Hanover, New Hampshire.

Barkhausen, Lehrbuch Der Elektronen-Rohren Und Ihrer Technischen Anwendungen, 1935, pp. Title, X, XI, 70-75, 78-81, 108-109, Band 3 (vol. 3), Hirzel Verlag, Leipzig.

Shoulders, Kenneth R., Microelectronics Using Electron-Beam-Activated Machining Techniques, Advances in Computers, 1961, Pages: Title Page, Index, pp. 135-293, vol. 2, Academic Press, New York.

Matsumoto et al., Deveopment of the C-Band (5712 MHz) 50 MW Class PPM Klystron (II), Proceedings of the 26th Linear Accelerator Meeting in Japan, 2001, pp. 225-227, Tsukuba, Japan.

Leahy-Hoppa et al., Wideband Terahertz Spectroscopy of Explosives, Chemical Physics Letters, 2007, pp. 227-230, vol. 434, John Hopkins University Applied Physics Laboratory & University of Maryland, Maryland.

The International Bureau of WIPO, PCT Notification Concerning Submission, Obtention, or Transmittal of Priority Document, WO Form PCT/IB/304, International Application No. PCT/EP2011/062803, International Filing Date Jul. 26, 2011, Priority Date Jul. 26, 2010, Applicant: Koops, Mailing Date: Sep. 16, 2011, Geneva, Switzerland.

European Patent Office, International Search Report and Written Opinion, International Application No. PCT/EP2011/062803, Date of International Search Completion: Aug. 29, 2011.

\* cited by examiner

DEVICE FOR GENERATING THZ RADIATION WITH FREE ELECTRON BEAMS

This patent application claims priority of and to European patent application no. 10170823.8, filed Jul. 26, 2010, which is incorporated herein in its entirety by reference hereto.

FIELD OF THE INVENTION

The present invention relates to a radiation source that makes use of the emission of electromagnetic THz-radiation from in vacuum free flying electron beams.

BACKGROUND OF THE INVENTION

Because there are several advantages using electromagnetic radiation with high frequency several approaches are known in the state of the art to achieve radiation in THz-frequency.

Many of the frequencies and wavelengths of importance to the spectroscopy of molecules and solid bodies may be within the wavelength range extending from 3 mm to 30 μm from 100 gigahertz to 10 terahertz. The use of a micro-radiation source, which may be tunable within the wavelength range and implemented on a semiconductor chip of a wafer for this range of terahertz radiation and which exhibits sufficient power output within the range of between 1 μW and 1 W, may be substantially significant from a technical standpoint for spectroscopic applications in all areas of environmental protection, analytics, and in material characterization in military fields, medicine and biology, as well as in chemistry and physics. In addition such a miniaturized source is needed in building source arrays for security applications like body scanners and applications of array scanners using THz radiation.

The terahertz range of the electromagnetic spectrum lies between the infrared and radiofrequency regions of the spectrum. Recent technological advances have allowed for exploration of the possible applications within this region of the spectrum. The electromagnetic radiation in the terahertz region has many potential applications including medical imaging and security.

Terahertz spectroscopy can be used for detecting and identifying biological, chemical and explosive materials. The spectroscopic database in the terahertz range of the electromagnetic spectrum is currently being compiled by labs throughout the world. In order to ensure safe employment of terahertz sources for such applications, the spectroscopy of biological materials and the interaction of terahertz frequencies with biological materials need to be studied in greater depth. Data of terahertz interaction with skin currently exists only from 0.1 to 2 THz.

The remaining portion of the terahertz spectrum—2 to 30 THz—remains unexplored. To enable the fielding of terahertz sources in many groundbreaking applications, it is necessary to further study the terahertz portion of the spectrum. A terahertz source and spectrometer would enable the biological research necessary to better understand the interaction of terahertz frequencies with biological tissue. The requirements are for a tunable terahertz source capable of producing energy from 0.1 to 7 THz at power levels of 1 W, CW. It is of importance to develop and produce powerful, tunable, affordable, and in addition miniaturized sources.

To generate certain frequencies in the far infrared range, coherent radiation for example, molecular lasers which are pumped by $CO_2$ lasers may be used.

Other sources generate a THz pulse power using very high electron energies e.g. several MeV—Millions electron volts—and wigglers, which are alternating solid state magnets which force the electron to wiggle around the axis and therefore emit electromagnetic radiation. Such sources are called free electron lasers and can be used in special high energy physics institutes by customers on an hourly basis for very high cost. In search for a small, possibly portable THz source such installations cannot be favored.

THz radiation sources of today use semiconductor diodes, so called GUNN diodes, which allow several GHz of oscillator frequency, disclosed in "H. Hartnagel et al. "Ballistic electron waves swing (BEWAS) to generate THz signal power", FREQUENZ Vol 63. Vol 3/4 (2009) 60-62". This radiation is then selected by special filters to extract higher harmonics of the base frequency and use this as "THz" i.e. 200 GHz radiation. The extracted power from such diodes is in the μ Watt regime. The usable primary diode current is limited by Joules heating. With the requirement for powerful sources in the upper GHz and lower THz regime, semiconductors cannot reach the goal. Currents in solid state and current densities are limited by Joules heating from the vibrating atomic lattice. This is a hard wall for such devices.

Another way to generate coherent radiation in the far infrared range with a higher power output is based on the so-called Smith Purcell effect. It was proposed in "S. J. Smith, E. M. Purcell, Phys. Rev. 92, 1069, (1953)". This new principle is based on the Smith Purcell effect, and uses a free electron beam crossing a metal grating to influence on this grating a vibrating surface charge which emits coherently THz radiation. The interaction of the DC primary beam with the standing emitted THz wave leads to a bunching of the beam and to an enhanced emission of the dipole radiation. It provides for generating radiation similar to the method known from the "free electron laser". Macroscopic electron sources and diffraction gratings having a 100 to 300 μm period may be used to generate a coherent radiation field of polarized radiation having up to 1 mW power. Such sources are also proposed in a miniaturized form in the U.S. Pat. No. 6,909,104 A.

The reference "Intensity of Smith-Purcell Radiation in the Relativistic Regime", J. Walsh, K. Woods, S. Yeager, Department of Physics and Astronomy, Dartmouth College, Hanover, N.H. 03755, U.S., pages 277-279, discusses the theory of such Smith-Purcell radiation sources and, additionally, gives experimental results. The reference "A New Source of THz-FIR Radiation" in LEOS NEWSLETTER, February, 1999 by J. E. Walsh, J. H. Brownell, J. C. Swartz, Department of Physics and Astronomy, Dartmouth College, Hanover, N.H. 03755-3528 and M. F. Kimmitt, Department of Physics, Essex University, Colchester, UK, Jan. 7, 1999, pages 11-14, discusses the design and mode of operation of a radiation source in the terahertz region. The experiments showed the feasibility of the approach disclosed in "M. Goldstein, J. E. Walsh, M. F. Kimmit, J. Urata, C. L. Platt, Appl. Phys. Lett. 71, 452 (1997)". It may be that these terahertz radiation sources are perfectly efficient, but they do not yet suffice for many analytical applications, and they are not yet miniaturized to a sufficient degree.

This effect is used and described in a miniaturized Smith Purcell THz-radiation source EP 1 186079 B1. This source is miniaturized by using the EBID technology and a self reproducing fabrication technique with 3-dimensional direct deposition of the key structures, as the electron emitter and the miniaturized focusing optics, like it is disclosed in DE 10302794 A1.

It is to note that THz sources based on the Smith-Purcell effect suffer from losses in the metal grating, and can theoretically achieve up to 1 mW output power.

It is an object of the invention to propose a device for radiating electromagnetic wave in the THz regime that comprises high output power.

The invention is based on the knowledge that Dynatron tubes are known to generate electromagnetic radiation.

Dynatron oscillators are known in the state of the art i.e. from a textbook which describes the mechanism of self excited oscillations and a principle how to obtain a current voltage characteristic which has a negative slope. This negative slope can be used to obtain a self excited oscillator and a radio waves emitting tube.

Furthermore it is known state of the art of FR 581 147 and DE 69 304 C that a dynatron tube may be used to directly produce electromagnetic radiation. The radiation power of those devices is not high enough to use it with THz frequency.

However, due to the technologies of the vacuum tube in times before the second World War only wavelength of the dipole radiation in the 10 MHz regime could be obtained, which then could be transmitted by additional transmitter radio tubes and wire antennas.

A Dynatron oscillator tube is therefore known since the 1930-ties. "H. Barkhausen, Dynatron in Elektronenröhren Band 1 (1945) S.75 and Bd.3 (1935), S.73ff, Hirzel Verlag Leipzig" discloses, that the frequency range which could be reached is limited to <10 MHz by the technology of tube fabrication. Electromagnetic radiation is emitted using broadcasting amplifier tubes and wire antennas. The broadcasted power of the electromagnetic radiation is limited by the resistive Joules losses which occurred by heating the antenna wires. A system efficiency of a Lecher 2 wire sender is reported to be 5%, see "H. Barkhausen, Elektronenröhren Band 3 (1935) S.109 u Hirzel Verlag Leipzig.

The Dynatron is a triode tube, which has an electron emitter at cathode potential, a strongly positive extractor grid and a less positive anode potential. The Dynatron uses the effect, that electrons which hit the anode release from there a certain number of secondary electrons. This ratio is dependent on the electron energy, the anode material, and with this also the emitted current. Rising the extraction potential it was observed, that an increasing secondary electron current, which flows from the anode to the grid reduces the tube current, and therefore the current voltage characteristic I/V-curve of the tube starts to fall. This gives instead of a positive slope of the I/V curve, a negative slope in the I/V curve. Using a resonance circuit in the anode circuit like an LC-combination—Inductivity and capacitor vibration circuit—enables in action with the negative part of the I/V curve to excite an oscillation. The Dynatron therefore was used as an oscillator in radio transmission stations. Due to radio-tube and fabrication technology, the oscillator frequency reached in the 1930 ties was in the upper MHz regime. With the technology turn to transistors and semiconductor circuitries a successful development of oscillators to the upper MHz and lower GHz regime was possible.

To overcome this difficulty Ken Shoulders made in 1961 the proposal to use free flying electrons in vacuum tubes "Shoulders, K. R. (1961). Microelectronics Using Electron-Beam-Activated Machining Techniques. In: Advances in Computers. Franz Alt, ed., Academic Press, New York, 135-293".

However the victory of the transistors in all the fields of electronics stopped the development of vacuum electronic devices for information transfer. However vacuum electronics succeeded in developing Microwave power sources, Gyrotrons and other satellite transmission tubes of today.

SUMMARY OF THE INVENTION

It is the idea of the invention to employ a Dynatron oscillator in a way that it controls the emission of Tera-Hertz-radiation by using two Free Electron Beams.

The invention relates to a Tera-Hertz-Radiation Source. As mentioned above, the device uses the principle of a Dynatron oscillator triode combined with free electron beams in a novel way.

According to the invention the device for generating electromagnetic THz radiation with free electron beams, comprises a Dynatron tube with the functionality, described above. The Dynatron tube comprises an electron source, an extraction grid and an anode, which is preferably coated with or of a material composition for high secondary electron emission, like Cu—Be alloy. All the components of the Dynatron tube are arranged in vacuum.

Furthermore the Dynatron tube is connected to a voltage supply that supplies an extractor voltage and an anode voltage with the setting that the extractor voltage is higher than the anode voltage. The device also comprises a self exciting oscillator, which modulates the anode voltage and the anode voltage is set to a work point voltage. The components of the device are arranged in a way, that the oscillator voltage accelerates in one half of the voltage swing a positive primary current flows to the anode and in the second half of the voltage swing such a high primary current, that a secondary electron current is emitted from the anode to the extractor which has twice the value of the primary current and therefore delivers a net—resulting—current and charge flow in reverse direction to the primary current.

This device leads to free flowing charges required for an emission of electromagnetic dipole radiation at THz frequency. Especially this can lead to the free flowing charges required for an emission of electromagnetic dipole radiation at THz frequency, with the dynatron tube and oscillator circuitry being integrated on an insulator into a vacuum tight cavity using one of additive lithography, micromechanical lithography and processing, and nanolithography methods, each source is constructed in a resonator and having at least one transparent window to emit the radiation and where the resonator is evacuated.

According to the invention, the dynatron tube is connected to at least two triode structures, where the triode structures are placed opposite to each other and send electron beams in according directions. The triode structures are connected in a way that an extraction voltage is fed to extraction grids of the triode structures by the dynatron tube. The electrons are emitted as free electron beam by the first triode structure in a first half-wave of the voltage delivered from the dynatron tube, whereas the second triode structure is connected to the dynatron tube via a capacitor, which reverses the voltage that controls the emission of the second triode. The second triode structure emits electrons as free electron beams in the now negative voltage drop of a second half wave of the dynatron voltage used as extraction voltage of the second triode structure. The free beams send each a half wave of a dipole radiation.

According to this setup the dynatron tube can therefore be used as a source for an oscillating grid-voltage applied to the grids of two separate provided vacuum triodes, which can be overlaid to each other to generate two free electron beams, which are flying in opposite direction and are switched by the grid voltage which is for the second tube reversed in polarity by a capacitor, which is placed in the grid supply line of the second tube. This results in the effect that the two in opposite direction flying beams also fly having opposite phase to each other.

Preferably the radiation is emitted into a resonator structure with dimensions designed to select wanted THz radiation.

Especially the device is fabricated in a miniaturized way, especially the dynatron tube, to allow THz oscillation of the oscillator voltage.

In a first advantageous embodiment, the distance between the anode and the extraction grid matches half the wavelength of the radiation to generate, which is the frequency applied by the vibrating oscillator.

According to the invention a miniaturized Dynatron oscillator Tera-Hertz-Source with Free Electron Beams, is described in the following. The setup uses only one Dynatron oscillator tube as an oscillator and an electromagnetic radiation emitter. The electron beam path is constructed in a way, that a miniaturized electron field emitter and extractor is built on the side of a hole. The emitter-extractor distance is <10 µm. The beam flies across the hole and hits the anode. The emitter to anode distance matches the half wavelength of the electromagnetic radiation, which is to be generated, e.g. 750 µm at 200 GHz.

Electrons flying from the emitter to the anode emit one half wave of the radiation like an antenna. By selecting the anode material and the electron landing energy at the anode in a way, that in one half wave of the oscillation a positive total current is flowing from the cathode to the anode, and in the second half wave the voltage of the impinging electron is risen that high, that a secondary electron current is achieved, which has the double value of the cathode emission current.

This results in a total net current flying from the anode to the grid in the opposite direction in the second halve wavelength. With this reversing net current in each half wave a free electron beam generates a dipole electromagnetic field which emits, according to literature from "H. Matsumoto "Development of the C-band (5712 MHz) 50 MW Class PM Klystron (II)" Proc. 26th Linear Accelerator Meeting Japan, 2001 up to 47% or at least more than 5% of the beam energy into the radiation as the Lecher transmitter does, who suffers Ohms loss in the wires of the antenna. At an extraction voltage of 100 V and with a total electron current of 10 mA the emitted THz radiation power can be 470 mW or at least 50 mW. Using 100 mA and 200 V, an expected emission of 1 W can be reached. Using a tunable capacitance in the Dynatron circuit allows changing of the oscillator frequency. The system is therefore also tunable. The electron beam should fly in one half wavelength at 200 GHz the distance between grid and anode of i.e. 375 µm. This distance is also the flying path of the net reversed current. It is necessary to obtain such a high current on a very small footprint of e.g. 30 µm, which would be 1/10 of the half wavelength. Assuming a cathode area of 30 µm×1 µm=$3 \times 10^{-7}$ cm$^2$ and a total current of 30 mA, the cathode has to deliver a current density of $10 \times 10^4$ A/cm$^2$=0.1 MA/cm$^2$. Wires melt if they are loaded with 0.125 MA/cm$^2$.

The oscillator is possibly embodied as a changeable complex resistor comprising at least one of a resistor, at least one of an inductivity and at least one of a capacity, or uses only one type, or 2 types of the three before mentioned construction elements. The elements can form a parallel resonator or a series resonator, as it is known from basic electrotechnics teaching. In an advantageous way the capacity or inductivity are tuneable. That way i.e. a fine tuning of the source is obtained via the external change of the oscillator capacitance.

In another case also a change in the oscillator inductance can be used. In any case an additional voltage controlled influence to the size of the capacitance or the magnetic field by the inductance is taken, e.g. by means of shifting an additional electrode near the capacitor, or generating an additional change of the inductance by e.g. connecting an additional line length in parallel.

To achieve the small distances necessary because of the high frequencies, the Dynatron tube and the oscillator circuitry are advantageously embodied as microstructures, where anode, extraction grid and electron source are connected with wires of high heat conductance and low resistivity and are integrated on an insulator which has a good heat conductance like Boron nitride BN or Diamond into a vacuum tight cavity using one of additive lithography, micromechanical lithography and processing, and nanolithography methods.

According to the invention the Dynatron tube can be fabricated in a miniaturized form with heated or cold electron source.

Especially, the electron source has a punctiform design and a material, a low work function and emits electrons at least in response to relatively low voltages, and is deposited on any tips of the field emitter using additive nanolithography. Advantageously the electron source is a cold field emission emitter in form of a wire with a tip of less than 0.1 µm tip radius constructed using additive nanolithography out of readily conductive material having stabilizing series resistance, and wherein the wire is positioned using computer-controlled deposition lithography on at least one of a straight design and a curved design to end freely over a surface of a conductor path structure for any electrical terminals and connections in any tips of the field emitter.

In another embodiment, the electron source is constructed in form of a cold field electron edge emitter from metal. Having a length of the emitting edge of <0.25 of the wavelength of the THz radiation and a work function of ca 4 eV like standard emitter materials like carbon, tungsten, gold, platinum, iridium or other refractory or normal metals and mixtures and alloys thereof have, or from semiconductors like e.g. silicon, or GaN gallium nitride having a low work function of 2.4 eV and having a stabilizing series resistance and an extractor constructed like a focusing cylinder lens in a short distance from the edge emitter and focusing the beam to the anode constructed in form of two metal blades positioned above and below the edge emitter blade having the same extractor potential and being constructed using optical or electron-beam lithography patterning and subsequent micromechanical etching and deposition processes, and has emitter and extractor electrodes as well as the anode metal areas connected to the external power supplies through metal conductor lines fabricated on the insulting base in extra process steps or in parallel with the emitter, extractor and anode fabrication steps.

The terahertz radiation source may furthermore comprise a controllable voltage source connected via at least one of an electrical terminals and connections to the miniaturized electron source to stabilize radiation from the electron source and wherein the electron beam exiting any tips of the field emitter is collected on an electrode of the anode.

In further advantageous embodiment the Dynatron tube is surrounded by the walls of a wave guide resonator, which improves the output efficiency. The wave guide resonator may be covered by a lens. For example using for the window of the cavity a focusing lens e.g. made from silicon or other for THz radiation transparent material, beam guidance and focusing to an area of interest is achieved.

In another embodiment, the miniaturized Dynatron tube and oscillator composed from field electron emitter, the electrostatic extractor or extraction lens, the anode, the oscillator circuitry, the potential supplying divider and metal lines are surrounded by a conducting housing in the rectangular form of a THz electromagnetic wave confining cavity resonator. The dimensions of the cavity resonator are adapted to the frequency and wavelength of the radiation to be emitted from the THz source and are encapsulated in a vacuum-tight manner, like with bonding techniques, by a micromechanically produced covering structure having an internal highly conducting metal wall, and having an insulating bottom on top of a radiation reflecting bottom and a ceiling window constructed from THz radiation transparent material to transmit the generated electromagnetic radiation for technical use to the ambient pressure outside.

A further improvement of the invention may be achieved with two miniaturized Dynatron tube structures and oscillators which are built on top and on the bottom of an insulating centrally arranged base having an open hole between the extractor and the anode, which results in two free electron beams emitted in synchrony and are built into a cavity resonator with two focusing lenses on each side and deliver doubled electromagnetic radiation power compared to the single beam system.

A further embodiment is a miniaturized construction with integrated oscillator circuitry all built into a wave guide resonator or cavity resonator to emit electromagnetic radiation with high efficiency and up to 1 Watt power in the 0.1 to 2 THz frequency range.

Today security questions and chemical detection and analysis systems require powerful, miniaturized, tunable and possibly portable radiation sources in the 0.1 to 2 THz regime. Security applications require the production of arrays of such sources in a dimension smaller than $4 \times 4 \times 4$ mm$^3$ each. The systems must be affordable and have an output power of up to 1 Watt.

In addition the total volume of the source is to be small. No specific higher order harmonic extraction waveguide network should be required. According to today's micromechanical technologies a low cost fabrication in arrays is possible to further miniaturize the security systems using THz scanners.

In the here presented invention now the Dynatron tube is used in a miniaturized form to produce a free flying electron beam inside a vacuum resonator. This radiates >5% of energy which is a much higher percentage than the Smith Purcell radiator is capable, which is <0.1%.

Since the components of the Dynatron tube need to be in a vacuum environment, another embodiment proposes that a whole device, miniaturized Dynatron Oscillator Tera-Hertz-Source with Free Electron Beams, is constructed inside a vacuum chamber, which is coupled to a pumping chamber. The pumping chamber is equipped with getter material to maintain the vacuum after sealing off the structure by bonding. Alternatively an active miniaturized Orbitron pump, as disclosed in DE 10241 549 B4 can be arranged and fabricated in the vacuum chamber near the cavity containing the Dynatron tube.

In an advantageous embodiment, a pumping cell may be attached to the device, especially to the cavity resonator, and connected to its volume through a grid or mesh structure which reflects the electromagnetic radiation, but transmits the vacuum from the pumping cell.

The vacuum can be produced with a conventional high vacuum pumping system, and/or a miniaturized vacuum pump is producing the high vacuum, e.g. a miniaturized Orbitron pump and/or deposited ionic getter materials.

In general, getter materials are used to evacuate the cavity for the required pressure of e.g. <$10^{-5}$ Pa to run field emission sources successfully and for a long time. Getter materials are capable of being activated by an electrode, to produce and maintain a required vacuum in the encapsulated structure.

The vacuum chamber of the Dynatron oscillator is in addition designed and structured to serve as a resonator for the THz electromagnetic radiation. The resonator structure is fabricated fixed for the selection of one wavelength.

In a further embodiment the wavelength is adjustable, which means, that the Dynatron Source can be tuneable. A tuneable Dynatron oscillator is realized by fine tuning of the capacitor of the oscillator circuit, and the point of landing of the electron beam by using an electrostatic or magnetic beam deflection field near the extractor to control the length of the electron beam by shifting the location of impact of the primary electron beam on the anode in parallel with the tuning of the resonator by moving the wall or walls.

In another preferred embodiment of the design, the resonator structure is designed and machined with at least one movable wall to select and tune the THz radiation for a tunable source by adapting the resonator. The walls can be made movable using micromechanically fabricated conducting blades, which are moved via electrostatic actuators which are located outside the resonator, or using other mechanical and electrical means, like actuators using NiTiNOL—memory-metal. Those actuators may be bent or shrunk by applying heat through current flow.

In a further design the Dynatron beam paths area between the grid and the anode is an open structure, and a second Dynatron Oscillator Triode is fabricated and placed below the first structure. The beams are flying in parallel and in phase to each other. This doubles the power of the emitted radiation.

In an advantageous embodiment an encapsulation of the system in a vacuum vessel is achieved due to bonding one or two THz radiation transmitting lenses, e.g. made from Silicon or other THz transparent material, to the resonator walls. The emitted THz radiation beam can be directed by arranging inclined mirrors outside close to the lenses which are positioned with an angle to the middle plane of the electron beams. This measure forms the emitted radiation as a broader beam, which can be generated and directed parallel to the middle plane of the two oscillator structures.

In a special way it can be constructed as a THz Emitter Cell with THz-radiation emitted out of the both sides of the source cell and is using inclined THz radiation mirrors e.g. in form of fine metal mesh areas to direct the radiation in a parallel direction, and uses at least one THz radiation focusing lens to supply the radiation in a focused manner to an object to be investigated in a distance, as it is needed for security systems as an element of a scanner line source array.

This design is in favor of fabricating combs of THz sources with sources arranged in a line to be used in scanners for security reasons. The design also is in favor of a miniaturized source array for such safety scanner applications e.g. in commercial product characterization with e.g. bar codes.

The fact that vacuum can be provided in mm to cm size cavities using commercially available getter materials and the resonator can be closed using THz radiation transparent Silicon products, like focusing lenses and wire grating reflectors one can further miniaturize the required vacuum volume, and fabricate many miniaturized THz sources in a row. Such rows can then be used to assemble individually switchable and controlled THz radiation emitters, as they are with advantage employed in Tomography and other phase and reflected intensity distribution analyzing systems in analytics and security applications.

In a further preferred embodiment such an array of sources can be fabricated to emit different wavelength selected according to the molecule vibration maxima which are to be analyzed in e.g. a process surveyor special field application like drug and explosive search.

In a further preferred embodiment of the invention the source and a source array can be made tunable. Using at least one NiTiNOL-engine to move the anode, and to change the oscillator frequency by coupling a capacitor or inductance to the circuit, the source becomes tunable and can be controlled externally. Two or more such NiTiNOL-engines can be employed to move the resonator wall in perpendicular directions. A tunable source is a preposition to spectroscopic analysis work, and can be achieved with such means. This embodiment of the miniaturized tunable Dynatron oscillator Tera-Hertz-source with Free Electron Beams is particularly advantageous in combination with high resolution spectrometers for THz fingerprint analysis for criminal, pharmaceutical medical and other reaction control and analysis. Also for detection of explosives and drugs the analysis of finger print absorption characteristic is required between 1 THz and 6 THz. As reported by M. R. Leahy-Hoppa et al./Chemical Physics Letters 434 (2007) 227-230 (John Hopkins Univ. Laurel Mo., Baltimore Mo., USA). Having a miniaturized system allows to implement such analytical technology for reaction survey and control in chemical technology in manifold industries and for homeland security.

It is a characteristic of the invention, that such a THz source is miniaturized and fabricated using modern in MEMS technology applied working steps like optical and electron beam lithography and multi-layer structure generation e.g. by lift-off and deposition, deep trench etching with e.g. the BOSCH process and bonding technology to seal the source. Using i.e. Focused Electron or Ion beam induced deposition and etching techniques, to manufacture the electron source, the extractor grid and the anode coated with a material with high secondary electron emission yield is preferred, however also standard microstructuring and deposition techniques can be used to fabricate the structure. Such materials for the anode coating are e.g. Magnesium oxide MgO, Titanium oxide, Diamond, Silicon dioxide or Silicon carbide, and also Silicon nitride $Si_3N_4$ or other inorganic or organic insulating layers. It is to be observed, that the impinging primary electron beam shall not modify the anode coating layer and should have a stable secondary emission coefficient.

The invention is in this situation to employ those modern micromechanical fabrication techniques to miniaturize the oscillator circuitry to the extent, that THz frequencies are achieved. For instance an oscillator frequency of 2 THz can be obtained according to classical electronic rules using a vibration circuit constructed from a capacitor $C=10^{-16}$ Farad, and an inductivity of $L=^{-11}$ Henry. Such a capacitor can be obtained using e.g. two metal lines of 10 μm length each with a distance of 1 μm covering an area of $3\times10$ μm$^2$. An inductivity of the required size is obtained by one loop of a wire surrounding an area of 5 μm width and 6 μm length. A whole DYNATRON oscillator triode with oscillator for the THz regime can be fabricated on a footprint of e.g. $10\times20=200$ μm$^2$. Such a circuit can be employed to serve as a clock in THz electronics.

Accordingly, it is a further object of the present invention to propose a solution for a miniaturized tunable Dynatron Oscillator Tera-Hertz-Source with Free Electron Beams and matching resonator and beam focusing lenses, which can also be fabricated in miniaturized form in linear and 2-dimensional arrays. The present invention is therefore directed to providing a free electron beam system to emit Tera-Hertz radiation, which is miniaturized to a further extent, which can be fabricated in arrays, and with multiple parallel and anti-parallel beams inside a resonator which is closed with radiation transmitting and focusing lenses, and which may be a more powerful source or source array for analytical, military and security applications.

In a further advantageous embodiment very bright electron sources are used as electron sources of the Dynatron tube. Those very bright electron sources are known from vacuum electronic developments like miniaturized cold field emitters and extractors built from novel materials using electron beam induced deposition EBID, which makes very bright THz radiation sources possible, as published by J. Kretz et al. Microelectronic Engineering 23 (1994) 477-481.

With the further subject of the invention to fabricate the electron beam system in a way, that its free flying electron and secondary electron beam can emit the THz radiation in a quasi bunched way without having the need for additional bunching arrangements, like wigglers in Free Electron lasers, or multiple grating periods in a Smith Purcell THz source or many cavities in traveling wave tubes. The sending system also does not use an amplifier and sending wire antenna, but all the functions are performed by the Dynatron triode tube itself. This is especially possible due to the goal of generating THz radiation, which has in a tunable source a wavelength of several μm to 1 mm. The electron source composed from emitter and extractor is fabricated in a size which is much smaller than 0.1λ of the THz radiation. Selecting the Anode material and its secondary electron emission characteristic, which defines the voltage E where no net current flies, and the components of the oscillator circuitry in a way, that e.g. emitted Se electrons can fly within half a period of the wanted frequency backwards from the anode to the grid, then the forward and backward flying current can emit the THz radiation in to the resonator adopted to the wavelength of the IR radiation emitted by the flying electron charge at the oscillating frequency.

This goal can now today be achieved with employing microelectronic optical- and electron beam lithography, single layer or multilayer structurization and deposition techniques, and using novel high current density carrying nano-granular materials and computer controlled EBID processes as well as micromechanical construction principles and processes.

The inventor has recognized that a strong need in security systems is to obtain miniaturized brilliant THz radiation sources, which can be fabricated at reasonable cost in large numbers, to miniaturize the space required per source and to enhance the number of sources employed to obtain scanning images of <3 m high persons in security systems. With a higher brilliance of the source the resolution can also be improved from 4 mm to <1 mm, which enhances the safety of the inspection result. Also miniaturized tunable sources are needed for spectroscopic investigations of small samples of chemicals in the laboratory and in the daily and military field.

According to a particularly preferred embodiment of the invention, the free electron beams which fly inside the resonant cavity are flying across a hole in the base substrate, and therefore cannot be retarded by charging a surface with image charges, as in the above quoted Free Electron Lasers and Smith Purcell radiators. In addition the beams act like the charges on an antenna wire and emit electromagnetic radiation. The special characteristic of the free flying electrons are, that there is no atomic lattice which is excited to lattice vibrations and generates Joules heat consuming energy for this excitation in the radiation emitting antenna, since this antenna is immaterially existing by the free flying electron beam. This holds for the forward and the backward flying electron or secondary electron current. In a second aspect, the invention is based on the use of single and also multiple very high brightness miniaturized electron emission systems, which are produced in minutes using computer controlled dimensional deposition using EBID of nano-granular materials.

In a further advantageous embodiment, a portable tuneable miniaturized THz Dynatron Source can be realized supplying all voltages and currents and controls from a portable pack which includes a battery of sufficient power and voltage for the at least one Dynatron tube and also includes the power supply and the control electronics for the tuneable device-parts of the system, which are the capacitor, the beam impact position at the anode, the anode position and the at least one electron emitter-extractor system.

According to a further embodiment of the invention a miniaturized dynatron tube serves as an oscillator and controls with its oscillating anode voltage two triode tubes, which are connected to the anode of the dynatron tube with their grids, and with their cathodes to the voltage E, which is the voltage for the zero net current in the Dynatron tube triode, and where the first triode tube is emitting a current to the triode anode in the first half wave of the oscillator voltage swing and by signal reversal by a capacitor the second triode tube is brought to emission in the negative voltage drop of the second half wave of the oscillator. In this embodiment the electron beams can be accelerated after being released from the extractor voltage on a way to an anode, which is the resonator wall, and having at the point of possible impact a hole, the electron beam can fly at the anode potential with the given anode voltage energy through the resonator, or at least through a tube in the resonator bottom, which has an opening perpendicular to the beam flying axis, which allows the flying charge pulse to emit the IR THz radiation into the resonator, which is formed and tuned to select the proper wavelength of this IR Radiation from the electromagnetic field generated by the electron beam. With a second electron beam generating triode, which shines its beam into the opposite end of the tube, which is accelerated to the same anode voltage, the charge pulse, which passes the aperture in the center of the resonator emits the second half of the electromagnetic wave for the IR radiation, which is guided inside the resonator.

Especially, both triodes are fabricated at the same surface but have a reversed position of cathode, grid and anode, and the grid to anode distance corresponds to the half wavelength of the THz radiation, which is to be generated, where the electron beams are emitted in opposite direction and emit the electromagnetic wave in each half period. This circuitry can be mounted in the center of a larger resonator, which selects the required wavelength according to waveguide dimensions and rules.

In a further embodiment, the Dynatron tube might also be combined with two standard triodes to emit dipole radiation. To emit dipole radiation the electron beam must change its direction every half wavelength. This can be achieved, if two standard triode structures are placed opposite to each other and are triggered to emit electrons in the half wave with a positive extraction voltage, which is fed to the triodes—from a power-oscillator tube—e.g. a miniaturized Dynatron. This circuitry requires high power and high density electron emitters. The advantage is the fine tuning of the wavelength by varying the L/C oscillator e.g. by a micromechanically varied capacitor, which is produced on the same chip. For THz oscillation a very small capacitor and inductance is required, which can be obtained using microlithography e.g. with standard optical lithography designing metal lines on an insulator substrate like Alumina-$Al_2O_3$— or other low k material. In this circuit the Dynatron is used in a classical way as an Oscillator amplifier.

In further advantageous embodiment the device can comprise a resonator that is positioned in between the extraction grid and the anode of the triode structures. The resonator can also be a structural unit with the anode.

The resonator or respectively the anode of the triode structure may comprise apertures, preferably holes of a diameter of $1/10$ of the wavelength, for entrance and exit of the electron beam. The number of apertures is matching the number of triodes. The apertures are positioned in opposite to each other. Due to the apertures, the pulses are reflected and retarded at the opposite electron source, and therefore get collected outside the resonator. According to this a reflection of electrons back through the aperture is prevented, which would reduce the pulse charge and the generation of the electromagnetic half wave.

In a further improvement, the resonator may be designed in a way, that the resonator covers the resonator area in emitting directions, only in the center of the resonator there is an aperture to emit THz radiation.

In a further design the Dynatron beam paths area between the grid and the anode is an open structure, and a second Dynatron Oscillator Triode is fabricated and placed below the first structure. The beams are flying in parallel and in phase to each other. This doubles the power of the emitted radiation, where the two miniaturized triodes as free beam generators, having their grids controlled with the voltage of the resonant circuitry of the oscillator and one having a phase shift of 180 degrees with respect to the other.

According to the foregoing description, it becomes clear that in this light the invention is superior to all solid state THz emitters, since the free flying electron beam in a cavity resonator right away emits the electromagnetic dipole radiation, without losing energy by heating an antenna wire or a line wire supplying the oscillating power to the sender antenna.

Since the nano-technological fabrication technology allows production of several electron beams along side of each other within a dimension of sub THz radiation wavelength, several in phase radiating emitters can be operated in parallel and with this scheme the total emission power is strongly enhanced. Using a top and a bottom beam or in another preferred embodiment of the setup multiple parallel beam systems on top and bottom, working in phase and sources arrangements within the resonator the output power can be doubled and multiplied in addition.

BRIEF DESCRIPTION OF THE DRAWINGS

Further advantages, features and potential applications of the present invention may be gathered from the description which follows, in conjunction with the embodiments illustrated in the drawings.

Throughout the description, the claims and the drawings, those terms and associated reference signs will be used as are notable from the enclosed list of reference signs. The figures show:

DESCRIPTION OF THE INVENTION

Figure 1A:
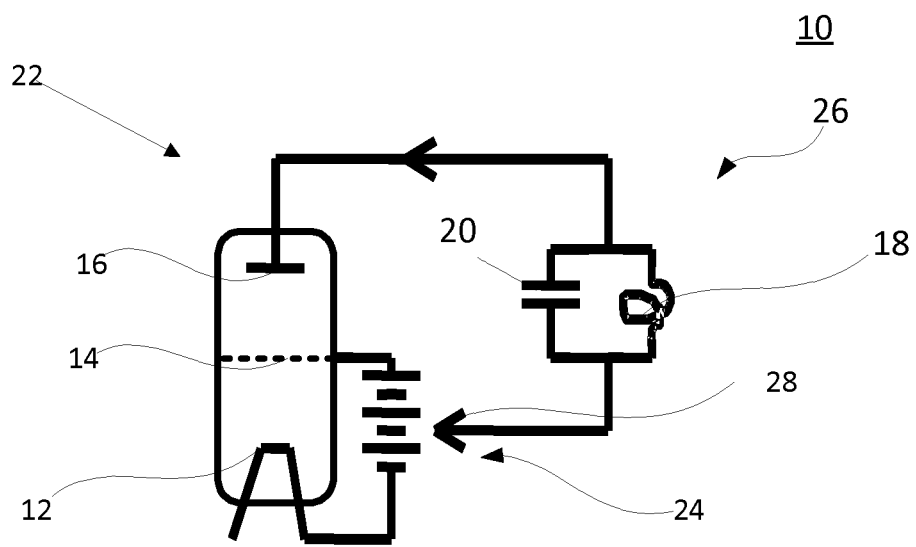
FIG. 1a a schematic view of a miniaturized device according to the invention.

FIG. 1a shows a schematic view of a miniaturized device 10 for generating THz radiation according to the invention. The device 10 comprises a Dynatron tube 22, a battery 24, and an oscillator 26.

The Dynatron tube, consists of a cold field emitter cathode 12, an electrostatic extractor in form of an electron transparent grid 14 positioned opposite to the field emitter cathode 12 and an anode 16. All the components of the Dynatron tube are enclosed in an evacuated environment.

The anode 16 is coated with a material layer, which allows a strong emitting of secondary electrons. The transparent extractor grid 14 is formed of two metallic beams.

Furthermore the oscillator 26 is embodied in a circuit composed from an inductance 18, a capacitor 20 and a metal wiring to connect the oscillator circuitry 26 to the voltage connecting point 28 at the grid voltage battery 24, supplying an alternating voltage to the anode 16. The battery 24 supplies a high grid voltage and a lower anode voltage.

Figure 1B:
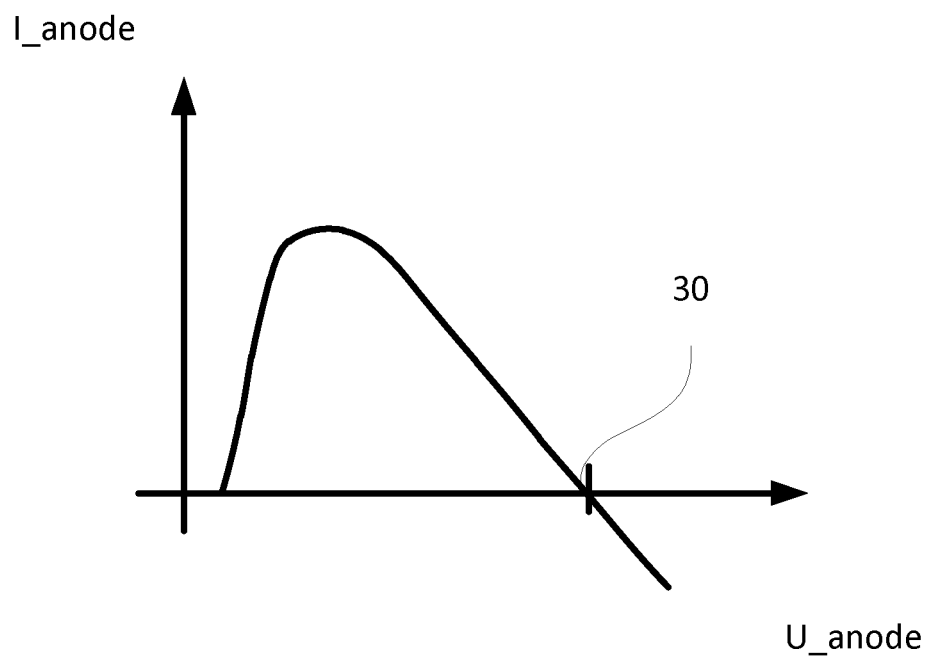
FIG. 1b a current/voltage characteristic of the anode of a Dynatron tube according to FIG. 1.

FIG. 1b shows the current (I_anode)/voltage (U_anode) characteristics of the anode, which is obtained due to the effect, that at a certain height of the anode voltage an increased number of secondary electrons is generated at the anode, which fly back to the higher grid potential and generate a resulting anode current, which can even become negative. The working potential point is situated where the anode current becomes zero. At this point emission current is equaled by the secondary electrons emitted from the anode.

Figure 1C:
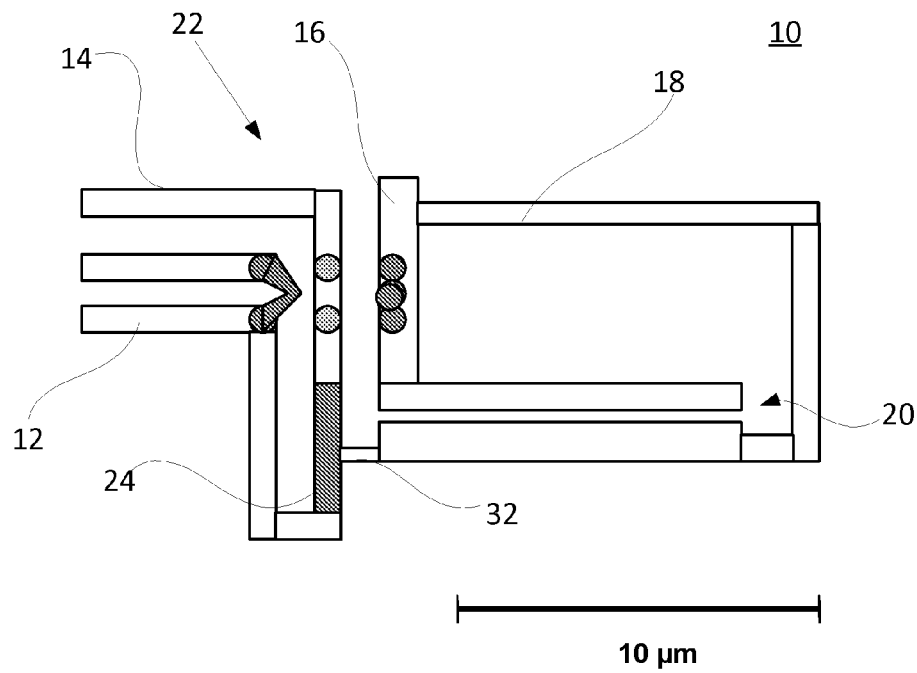
FIG. 1c a layout for the structure of the device according to FIG. 1.

FIG. 1c shows the Dynatron oscillator, and the wiring of the components, which is to be produced on an insulating substrate using optical- or electron-beam lithography and a standard lift-off process as a wiring pattern, onto which by computer controlled EBID for the cathode the electron emitter is constructed in form of a hair pin, which can be heated by a heater current, and also extractor rods and anode rods are constructed using the computer controlled EBID technology. Also an unheated single rod EBID electron emitter can be used.

FIG. 1c shows a possible layout for the device. Here the cathode 12 and the extraction grid 14 are shown as fabricated with electron beam induced deposition as rods of 200 nm diameter and 1 µm in length, both deposited on metal lines prefabricated by lithography and lift-off technology on an insulating substrate (not shown). Also the anode 16 is shown as a deposited rod structure of e.g. 1 µm in height, coated with a high SE emitting material. Furthermore the oscillator comprises a parallel plate capacitor 20 and an inductance 18 of appropriate size, which can be just a line and needs not to be a circular loop.

The device 10 additionally comprises a potential divider voltage pickup 32 from a resistor, also fabricated by EBID to set the voltage for the oscillator middle voltage point of the battery 24.

It is anticipated that a total size of the miniaturized device is <20×20 µm. This is much smaller than the expected emitted wavelength of the THz-radiation.

Figure 2:
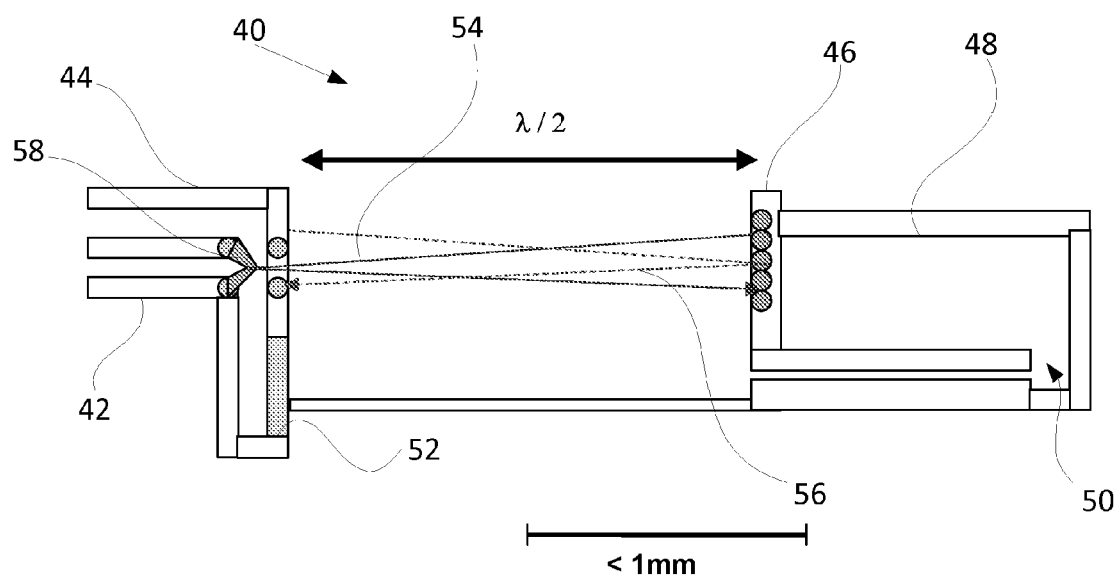
FIG. 2 a schematic layout of the metallization pattern and the EBID emitter, extractor and anode of a Miniaturized Dynatron Oscillator Tera-Hertz-Source with Free Electron Beam.

FIG. 2 shows a schematic layout of the metallization pattern of the device 40 including the EBID emitter 42, extractor grid 44 and anode 46 of a miniaturized Dynatron tube combined with a LC oscillator 47, comprising an inductance 48 and a capacitor 50, which assembles to a Tera-Hertz-Source with Free Electron Beam. In this preferred embodiment of the invention the distance between electron emitter 42 and extractor grid 44 of the tube is fabricated in a miniaturized way not larger than $0.1*\lambda/2$ of the THz radiation to be emitted. At the distance of $0.1\lambda$ up to $\lambda/2$ to the extractor grid 44, the anode 46 is placed. The distance is limited by the time of flight of the released secondary electrons and the oscillator voltage swing.

The oscillator base voltage that is supplied by battery 52 is chosen in a magnitude, that primary current and resulting backward current have a balanced charge and therefore emit the THz radiation in phase and with equal amplitude. This Dynatron-THz radiation source needs only one electron beam source 58, but needs a larger footprint than the Dynatron tube itself due to the oscillator circuit. A primary electron beam 54-represent as full lines—is emitted from this electron beam source. A secondary electron beam 56-dashed lines—is generated in the anode 46 by the second half wave which is set to be a secondary beam current that is twice the primary beam current.

The secondary beam current is emerging from the anode due to excitation by the impact of the primary electrons and enhanced by a special coating of the anode. Both electron beams are free electron beams and therefore emit a high amount of radiation.

Figure 3:
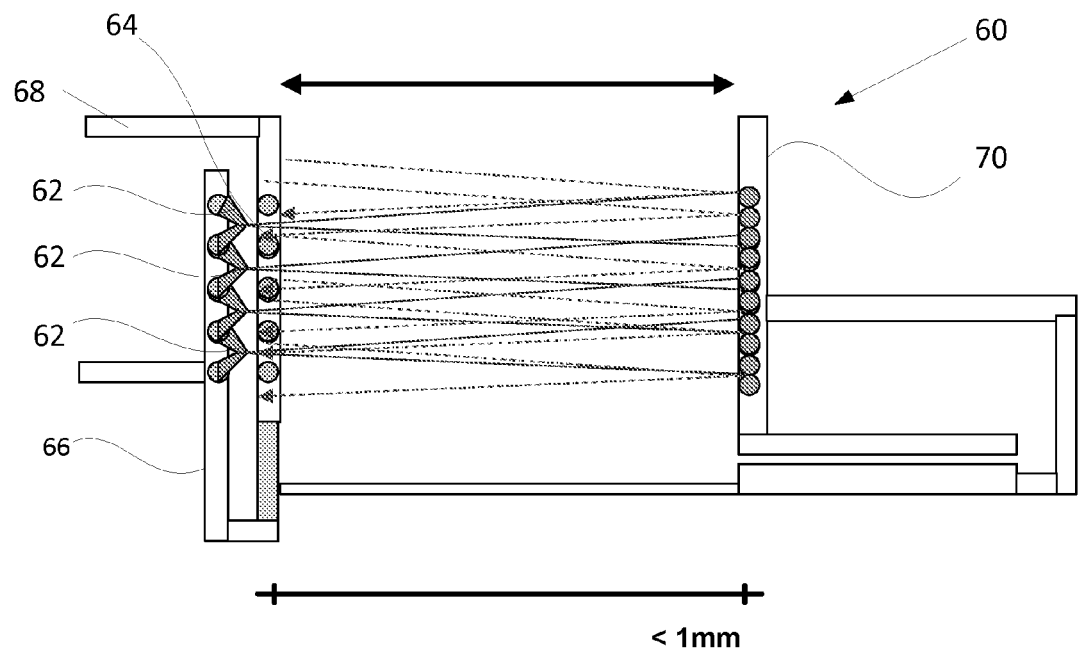
FIG. 3 a schematic layout the metallization pattern with multiple EBID emitters, extractors and an anode of a Miniaturized Dynatron Oscillator Tera-Hertz-Source with Free Electron Beam.

FIG. 3 shows a possible wiring pattern layout for a Miniaturized Dynatron Oscillator Tera-Hertz-Source 60 similar to that of FIG. 2, but with multiple parallel free electron beams in one circuit with one vibration oscillator supplying the anode voltage with THz frequency, emitted from multiple cathode emitter tips 62, each having an extractor 68 and the grid to anode 70 flight distance is adapted to the flight time of secondary electrons in the time of half a oscillation, required to emit the half wavelength of the THZ electromagnetic radiation by the primary beam in the first half wave and as the voltage from the oscillator circuit 66 generates by the resulting backward flying charge from the high secondary electron beam attracted by the extractor grid 68 in the second half wave. The IR radiation is generates in a smaller area than a wavelength, but can be selected and guided by a resonator of λ/2 dimensions.

Increasing the number of beams in one plane raises the power of the emitted electromagnetic radiation. In this embodiment the multiple parallel free electron beams emitted from multiple miniaturized EBID-field emitter tips 62 and controlled by the multiple EBID extractor rods 64 one each for each field emitter tip 62. The Anode 70 is also a larger number of EBID rods in parallel fabricated with EBID with a material with the appropriate SE-emission coefficient and characteristic for the backward current having twice the size of the primary current. As already shown in FIG. 3, the full lines represent the primary electron beam, the dashed lines represent the free beams in the second half wave, which is set to a voltage which generates a secondary electron beam current which is twice the primary beam current.

Figure 4:
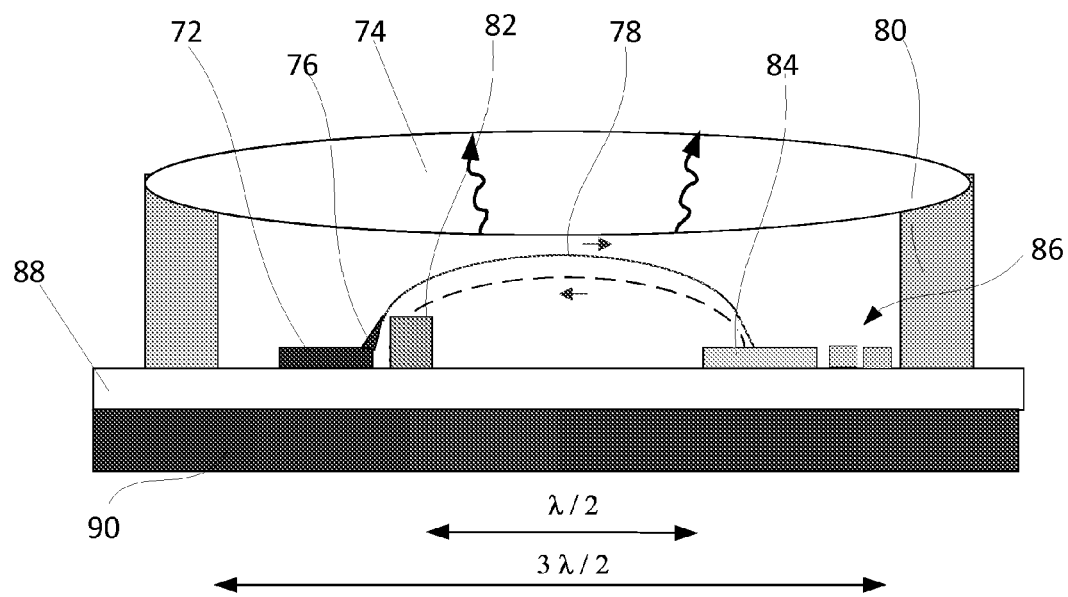
FIG. 4 a schematic lateral view of a miniaturized device integrated in a cavity resonator.

FIG. 4 shows a schematic lateral view of a Miniaturized Dynatron Oscillator Tera-Hertz-Source with one free electron beam built within a cavity resonator 80. All the components of the device are built on an insulating substrate 88 with radiation reflecting base into the side walls of the cavity resonator 80. The cavity is encapsulated by a focusing lens 74. The focusing lens 74 is made from silicon or other THz transparent material shaped to focus the THz-radiation.

The distance between the extractor grid 82 and an anode 84 is 0.01 to 0.5 of a wavelength of the THz radiation. The base material 90 and the insulating substrate 88 is an SiO2, Diamond, or Boron nitride insulator coating. The vacuum filled free space of the cavity resonator structure 80 works like a spectrometer in so far that the resonator dimensions select a stable electromagnetic wavelength and amplifies and sends this along its axis. Cavity resonators 80 have long been known in microwave technology as conductors for THz radiation energy. They need to have good conductivity in their walls and are generally closed on 4 sides around their axis.

Figure 5:
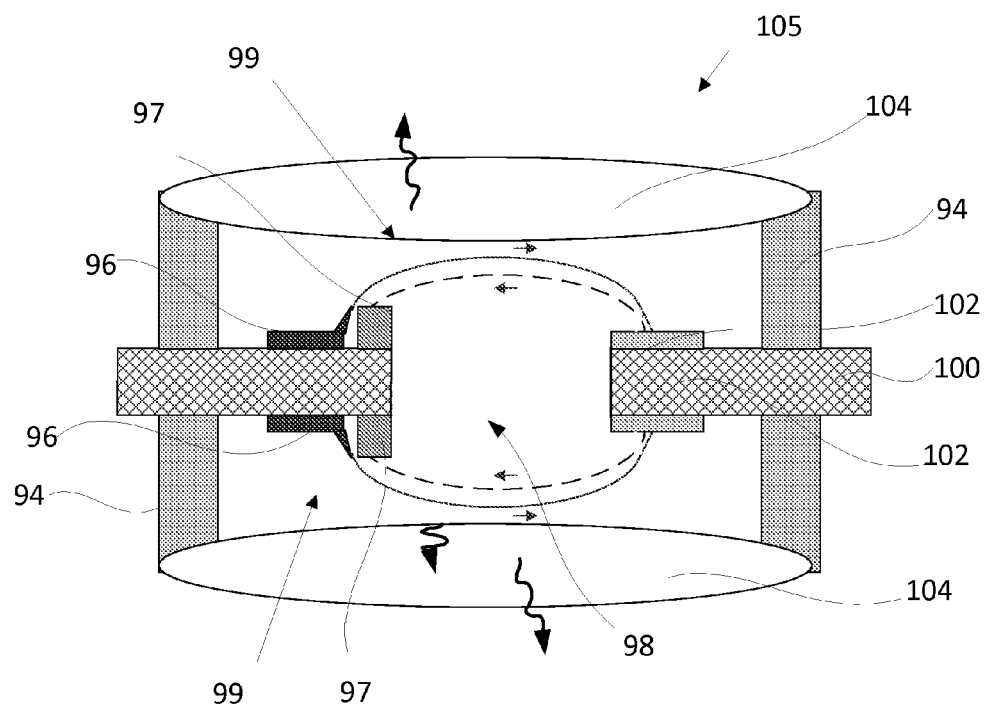
FIG. 5 a schematic lateral view of a Miniaturized Dynatron Oscillator Tera-Hertz-Source with two Free Electron Beams built into a cavity resonator.

FIG. 5 shows a schematic lateral view of a THz Emitter Cell 105 comprising two Dynatron tubes 99 to generate two Free Electron Beams built into a cavity resonator 94 with conducting sidewalls on top and bottom of a central base 100 with a hole 98 of the size of 0.01 to 0.5 of a wavelength and with the cavity closed by radiation transmitting and focusing lenses 104 on each side. The two identical Dynatron tubes 99 each comprise an electron source 96, extractor grid 97, and an anode 102.

The free electron beams emitted in synchrony on top and bottom of the base 100 from the electron 5 sources 96 to the anode 102 across a hole 98 in the base 100. The base 100 is built from an insulating material and fabricated into a cavity resonator. This preferred embodiment delivers a doubled radiation power compared to the single beam system.

Figure 6:
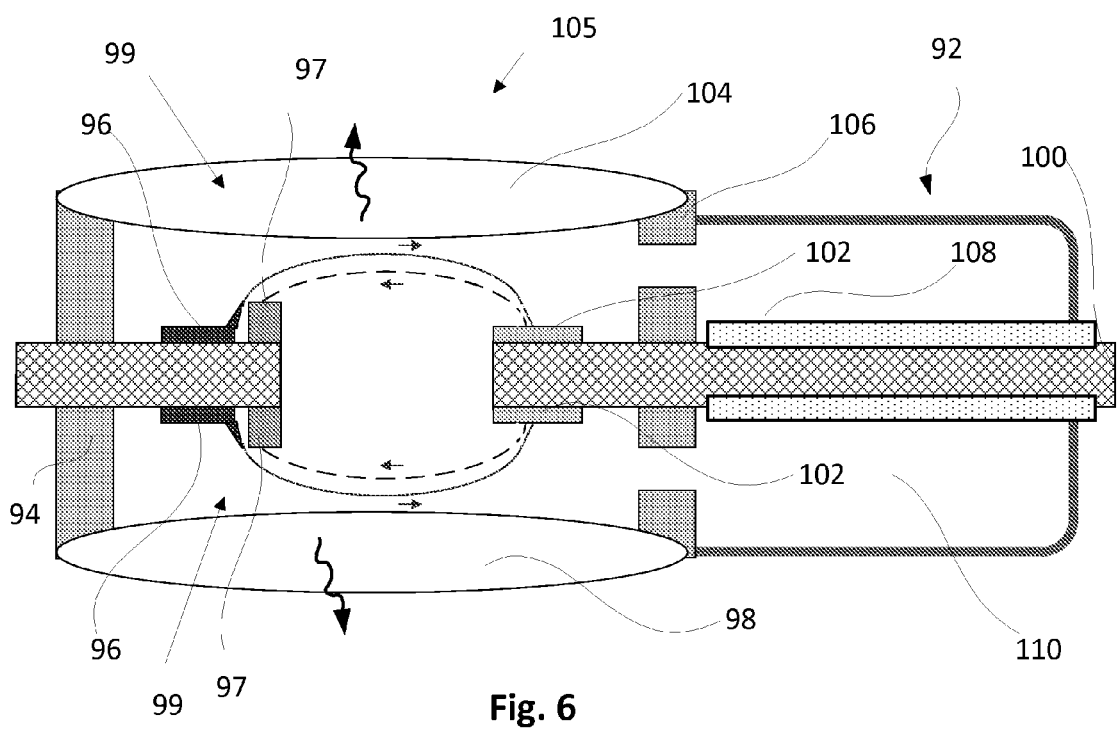
FIG. 6 a schematic representation of a miniaturized Dynatron Oscillator Tera-Hertz-Source with Getter.

FIG. 6 shows a schematic representation like FIG. 5 of a miniaturized Dynatron Oscillator Tera-Hertz-Source with Getter material. In this advantageous embodiment of the invention, supplying the vacuum to the miniaturized Dynatron Oscillator Tera-Hertz-Source is achieved due to a pumping cell 92 that is attached to the miniaturized Dynatron Oscillator THz Source. The pumping cell 92 contains a vacuum pump, like a miniaturized Orbitron pump, as taught by H. Koops Miniaturized Orbitron Pump DE00001024154984 (not shown in this figure) in a cavity 110 where the cavity 110 is connected to the THz resonator.

In difference to the embodiment in FIG. 5 one wall of the cavity resonator is replaced by a pumping cell wall 106 that is vacuum transparent, and designed as a good conducting THz reflector, e.g. a tight metal grid side wall with pitch<<λTHz radiation.

The base 100 that stretches from the cavity resonator 80 into the pumping cell 92 is coated with getter material 108 on its bottom and top surface. This provides a chemical pumping power by the composition of the getter material and its activation by heating to absorb gas atoms and chemically bind those in solid deposits. In this way the gas volume is depleted from gas molecules, and the cavity is pumped to a high vacuum over very long times, e.g. years.

Figure 7:
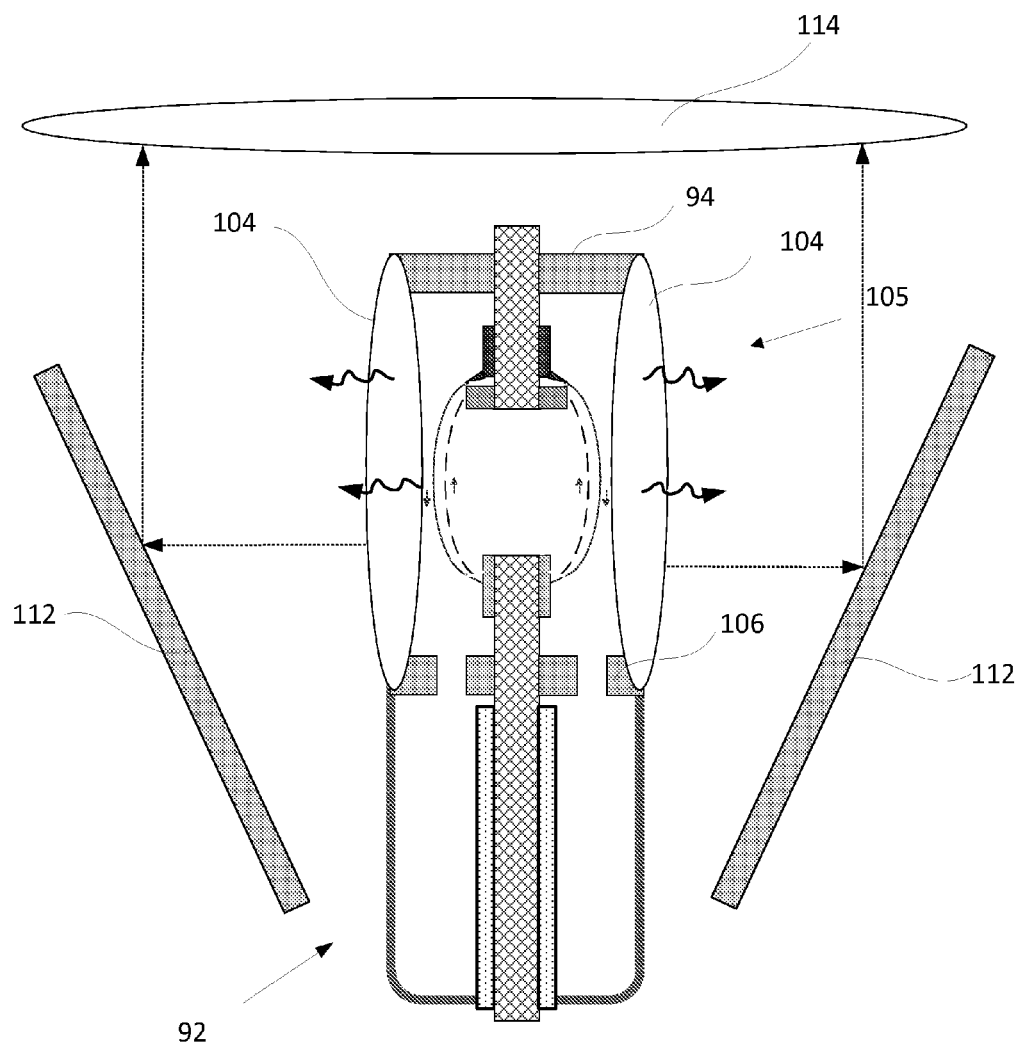
FIG. 7 a schematic cross-sectional view of an Dynatron Oscillator Tera-Hertz-Source with mirrors and bundling lens.

FIG. 7 shows a cross-section drawing of a miniaturized Dynatron Oscillator Tera-Hertz-Source. The miniaturized Dynatron Oscillator Tera-Hertz-Source has an attached pumping cell 92 like FIG. 6. The free flying electron beams in the THz-cavity resonator 94,106 emit radiation through lenses 104 and the beam is directed with mirrors 112 and with a focusing lens 114 to form and focus the beam.

Using the mirrors 112, the beams emitted through the lenses 104 in opposite directions can be bundled by the lens 114, which leads to a beam with doubled intensity.

Figure 8:
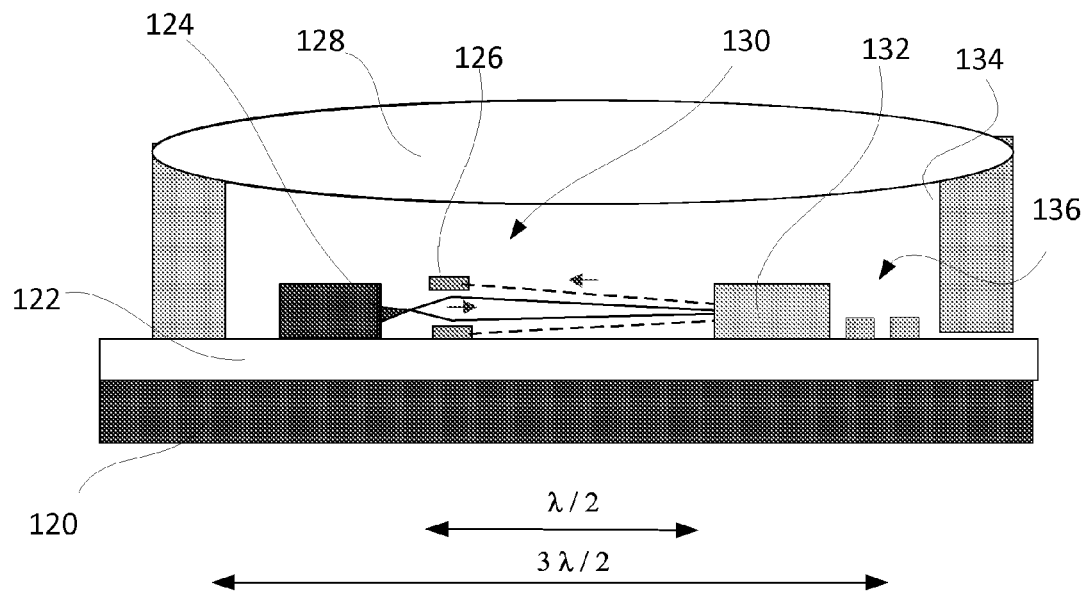
FIG. 8 a schematic side view of a Miniaturized Dynatron Oscillator Tera-Hertz-Source with a blade shaped metal edge emitter.

FIG. 8 is a schematic side view of a Miniaturized Dynatron Oscillator Tera-Hertz-Source with a blade shaped metal edge emitter 124 to emit free electron beams. The emitted electron beams are focused by an extractor cylinder lens structure 126 made from two metal blade shaped electrodes having a slot in between and through which the extracted cold field electron emitted electron beam is focused to the anode 132. Metal edge emitter 124, cylinder lens structure 126, and anode 132 form a Dynatron tube 130 that is built into a cavity resonator 134 closed with a transparent THz-radiation focusing lens 128. The grid 126 to anode 132 distance is 0.01 to 0.5 of a wavelength. The base 120 material and resonator bottom 122 is e.g. an Si02 insulator coating the base 120. The vibrating circuitry 136 is also fabricated near the anode 132 which is also coated with or made from a material with a high secondary emission factor to generate the reverse flying net charge in the second half wave, not shown. The device furthermore comprises a highly conductive resonator side wall 134, and a lens 128 made from silicon or other THz transparent material shaped to focus the THz-radiation.

This preferred embodiment of a THz source uses a much higher primary current than a single point field emitter source due to the several nm in size the metal line surface protruding crystal edges generated in the metal deposition process, and has the advantage that it can be fabricated with standard optical and electron beam lithography and all MEMS fabrication compatible fabrication process steps, and does not need the expensive FEBIP Focused Electron Beam Induced Processing Technology. The extension of the cathode and focusing lens should be confined to <0.5, preferred <0.1 of the half wavelength of the emitted radiation to generate a good dipole radiation emission characteristic. Preferred materials for edge emitter 124 are noble metals, and alloys having a characteristic crystal size in the 10 nm regime.

Figure 9:
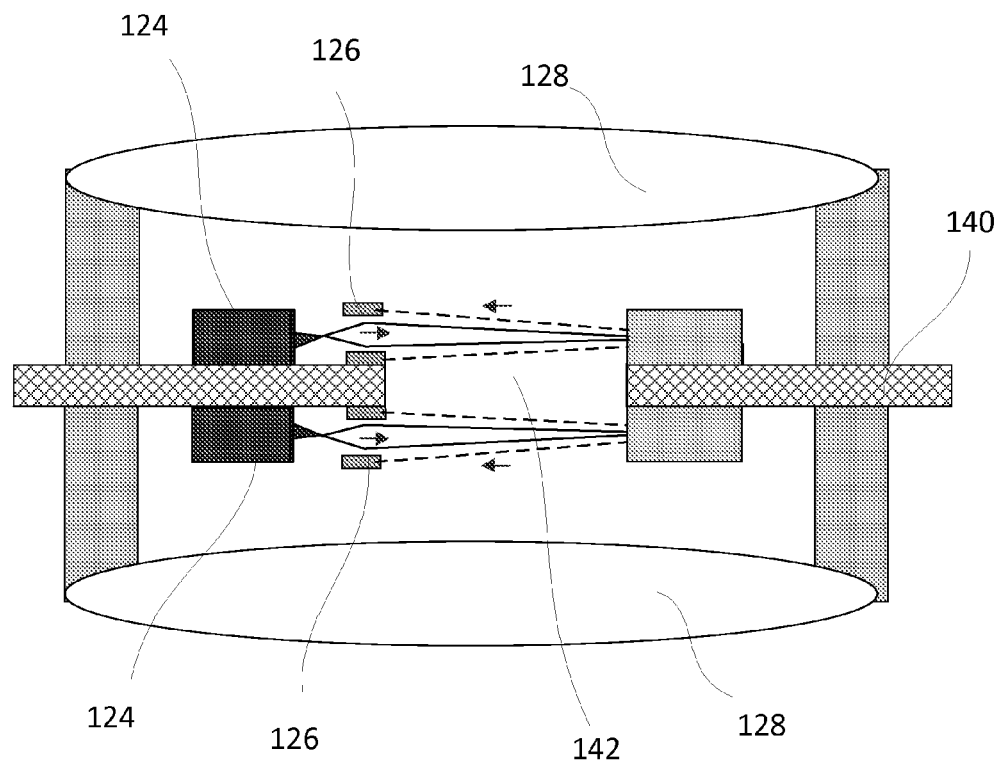
FIG. 9 a schematic side view of a Miniaturized Dynatron Oscillator Tera-Hertz-Source with two blade shaped metal edge emitter within a cavity resonator.

FIG. 9 shows a schematic of a miniaturized Dynatron Oscillator Tera-Hertz-Source with two metal edge emitters 124 where each emits free electron line beams that are extracted with the help of an extractor cylinder lenses 126.

The free electron beams are emitted in synchrony on top and bottom of a base 140 from the electron sources 124 to the anodes 132 across a hole 142 in the insulating base 140, having a vibration oscillator structure like on the top of the base also on the bottom of the base built into a cavity resonator 144 with two focusing lenses 128 for THz radiation on each side. This preferred embodiment delivers a doubled radiation power compared to the single beam system. Preferred material of edge emitters 124 are noble metals, and alloys having a characteristic crystalline structure in the 10 to 100 nm regime.

This type of a miniaturized Dynatron Oscillator Tera-Hertz-Source may also be combined with a vacuum cell like shown in FIG. 6 or FIG. 7.

Figure 10:
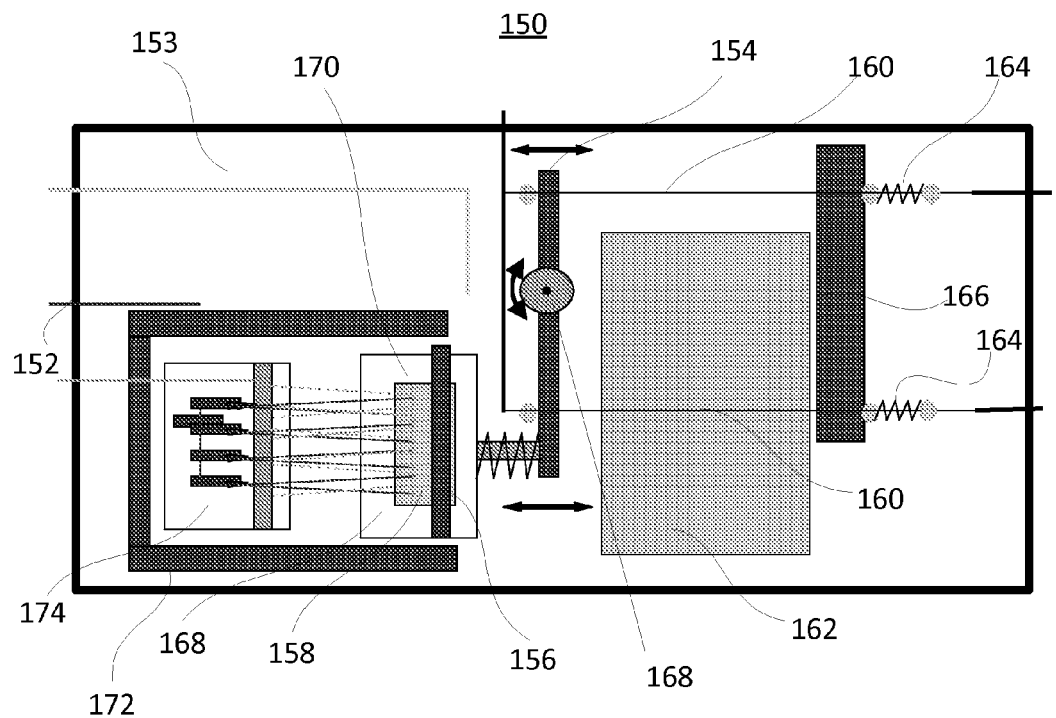
FIG. 10 a schematic top view of a tunable setup of a THz-Source.

FIG. 10 shows schematic top view of a tunable THz Dynatron Source 150 with two wires 160 and current flow driven NiTiNOL-stage for fine tuning by moving one wall 156 of the cavity resonator and moving the anode 158 with a lever 154.

The system is encapsulated with all surrounding walls of a frame 152 fixed to a base plate 153. The cavity is evacuated using Getter pumping with Getter material 162 placed in the area of the NiTiNOL stage setup.

There are NiTiNOL wires 160 for pulling right or left. The wire contracts up to 5% if heated by current flow. To achieve repeated contraction the wires are expanded by a spring 164 after contraction is sufficient to reach a position of the lever 154. The wires act against a block 166 positioned unmovable relative to the frame 152 and base plate 153. The spring 164 is used to expand the wire if no further contraction is needed. The two wires act on a lever 154. This pivots around an axis 168. The lever-position is stabilized by friction between the lever 154 and the base plate 153, both having fine ground surfaces, and the axis 168 is plate spring loaded to press the lever 154 to the base plate 153. The position of the lever 154 can be monitored with high precision using e.g. strain gauges on a beam, which is mounted with one end on the base plate 153 and is bent by the lever motion.

An insulator plate 168 carrying the anode 158 is linked via a push and pull rod 170 to the lever 154. With pivoting the lever, the resonator wall 172 that is also bound to the insulator plate 168 as well as the anode 158 can be moved relative to the cathode assembly 174 and the frame 152. The position of the insulator plate 168 is adjusted due to wanted wavelength.

Two or more such engines can be employed to move the resonator wall in perpendicular directions, and also with one movement the anode.

Figure 11A:
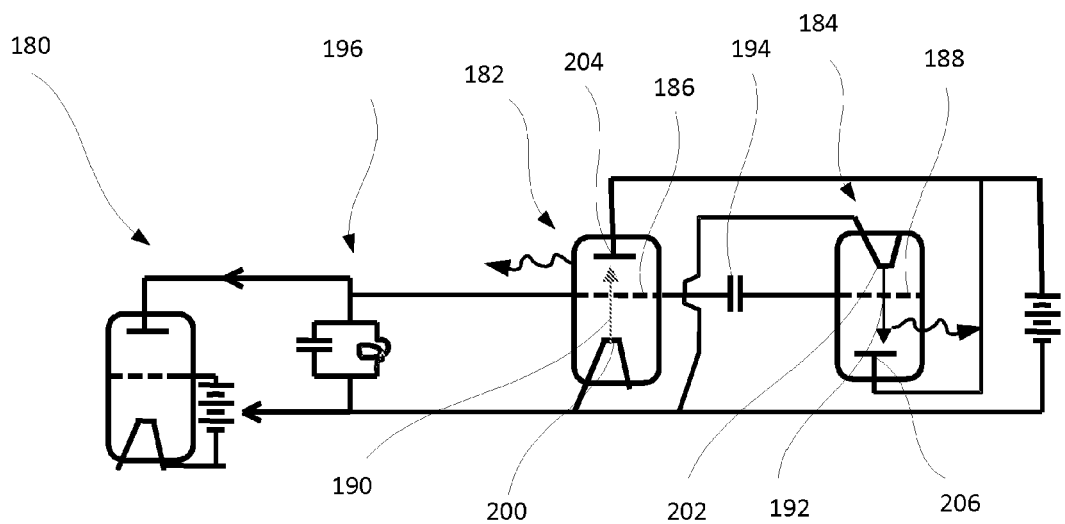
FIG. 11a a schematic view of a dynatron tube using triode tubes to generate free electron beam radiation.

FIG. 11a shows a schematic circuitry view of a setup comprising a dynatron tube 180 connected to two free beam triodes 182, 184 to generate THz radiation.

According to this setup the dynatron tube 180 is used as a source for an oscillating grid-voltage applied to the grids 186,188 of two separate provided vacuum triodes 182,184 which are overlaid to each other to generate two free electron beams 190, 192 which are flying in opposite direction and are switched by the grid voltage which is for the second tube reversed in polarity by a capacitor 194, which is placed in the grid supply line of the second tube. This results in the effect that the two in opposite direction flying beams also fly having opposite phase to each other.

The cathode 200 of a first free beam tube 182 and the cathode 202 of a second free beam tube 184 having opposite phase to the first tube 182 and opposite beam direction. To emit the THz radiation in synchronism and at the same location the tubes are fabricated on the same substrate on top of each other that is described in FIG. 11b.

In between the tubes 182, 184 is a capacitor 194, which reverses the controlling voltage of the grid 186, 188, which controls the electron emission current of the cathodes 200, 202.

Figure 11B:
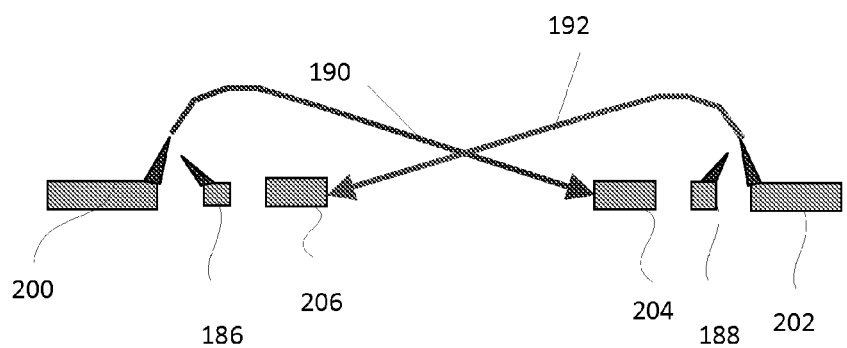
FIG. 11b a side view of a two in one plane constructed free beam triode tubes having Opposite phase and beam direction.

FIG. 11b shows as a detailed side view of the two free beam triode tubes 182, 184 having opposite phase and beam direction that are constructed in one plane. The triode tubes 182, 184 as described in FIG. 11a each comprises a cathode 200, 202 and each an anode 204, 206.

Figure 11C:
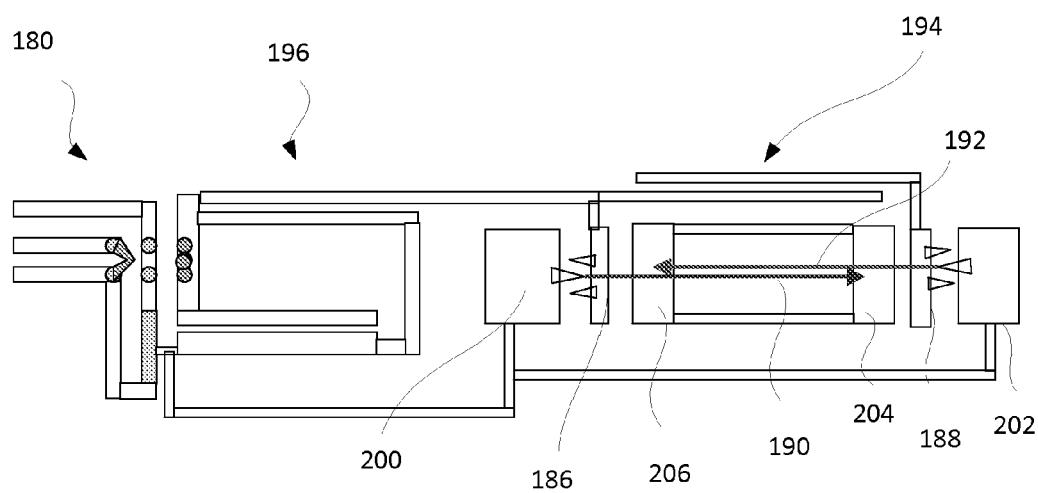
FIG. 11c a schematic layout the metallization pattern of a dynatron tube connected to radiating triode tubes.

FIG. 11c shows the mask layout for the metal line wiring pattern which is to be the top view of the layout of the THz DYNATRON oscillator tube 180 and two free beam triode tubes 182, 184 having opposite phase and direction, which are controlled by the oscillator voltage as grid voltage. The triode tubes 182, 184 are designed in a superimposed fashion to guarantee the same line of radiation emission of the 20 two free beam triode tubes 182, 184, which emit electrons in an alternating in phase linked fashion. The anode 204 of the first free beam tube 182, and the anode 206 of the second free beam tube 184 are arranged in the same plane. The voltage supply for the anodes is not shown, however, selecting a voltage as high as electrically possible in the miniaturized design allows to increase the emitted IR radiation power. The phase shifting capacity 194 is responsible for the backward beam and changes the sign of the voltage for the backward beam. The oscillating current emits THz radiation.

The triodes may be produced on an insulating substrate by optical or electron beam lithography and using lift-off-metallization, which is in parts used for the deposition of the field electron cathode 200, 202 and the extractors grids 186, 188.

Figure 11D:
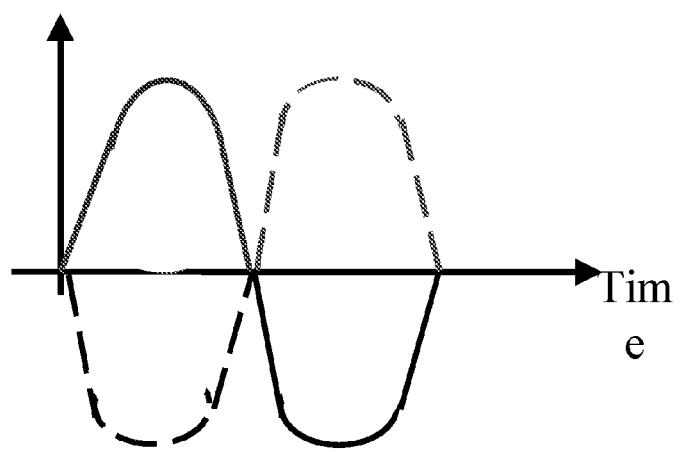
FIG. 11d a graph of emission current of dynatron tube versus time for the two triode tubes.

FIG. 11d shows the tube emission current versus time for the two tubes in one graph.

Figure 12:
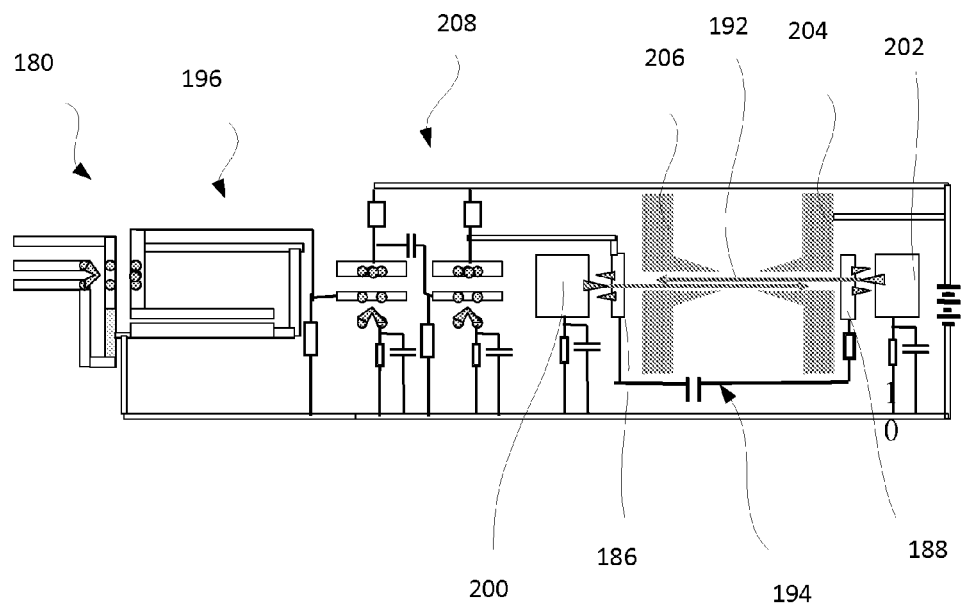
FIG. 12 a schematic circuit layout for the three components of a Miniaturized Dynatron Oscillator Tera-Hertz-Source with a Dynatron Oscillator for THz voltage oscillations, where its voltage is amplified with at least one stage amplifier.

FIG. 12 shows a further embodiment of the device, as a schematic circuit layout for the three components of a Miniaturized Dynatron Oscillator Tera-Hertz-Source with a Dynatron Oscillator for THz voltage oscillations. This voltage is amplified, if necessary with at least one stage amplifier, which is built with EBID as a micro triode to amplify the THz voltage signal, used to control the extractors 186, 188 of two free beam electron sources which each send the beam into and across a resonator 204, 206. The two powerful field emission micro triodes send their beam through a hole in the resonator cavity 204, 206 which serves as an anode with a hole to transmit the beam through the resonator 204, 206 as a free flying electron beam. The beam impinges finally to the resonator wall, since the extractor voltage at the exit hole is negative at the end of the time of flight of the first beam, since a signal reversal is built in with the capacitor 194, to obtain an electron beam in the second half oscillating voltage period, when the first extractor 186 has a negative voltage.

One electron source is supplied with the amplified oscillator voltage to control the emitted electron beam in the first half of the oscillation with positive value with respect to the cathode 200, a coupling capacitor 194 is used to reverse the signal, which then controls the extractor 186, 188 for the second electron beam source to send the electrons into the resonator 204, 206 in the second half wave of the oscillating voltage from the right side to generate the second half wave of the Hertz dipole radiation. The amplifier stage 208 can raise the extraction voltage for the electron beam sources 200, 202 to the working point for high field emission current. The separate voltage supplied to the resonator 204, 206 as an anode voltage raises the beam energy and therefore increases the radiation output of the IR source up to 47% of the pulse beam power inside the resonator.

The amplified voltage which oscillates with the THz frequency as given by the Dynatron 180 is therefore fed to a THz radiation generator.

The amplifier stage 208, is fabricated like the Dynatron triode and the electron emitter triodes by EBID on prefabricated metal lines. The intermediate amplification is beneficial to provide high extraction voltages to obtain a high electron beam which in turn is a high charge pulse which emits the THz-IR Hertz Dipole radiation. The layout of such an one-stage or, as given here, a two-stage amplifier is designed according to state of the art radio signal amplifiers, but in contrary to radio frequency amplifying tubes, here THz signal amplifying miniaturized field emission triodes are used. They cover a footprint of the layout of <10 µm×10 µm.

FIG. 12 a shows a schematic circuit layout for the three components of a Miniaturized Dynatron Oscillator Tera-Hertz-Source with a Dynatron oscillator for THz voltage oscillations, built as a serial resonator, with two triode electron sources 200, 202, which are controlled by the oscillator voltage in their emissions, and by the anode voltage of the resonator, in their energy. The two triode beams 192 fly through the tube in the bottom of the resonator 204, 206 where an aperture 212 connects the electromagnetic radiation from the charge pulses into the resonator 204, 206, where one forward and one backward flying pulse excite one wavelength of the IR radiation.

Figure 12A:
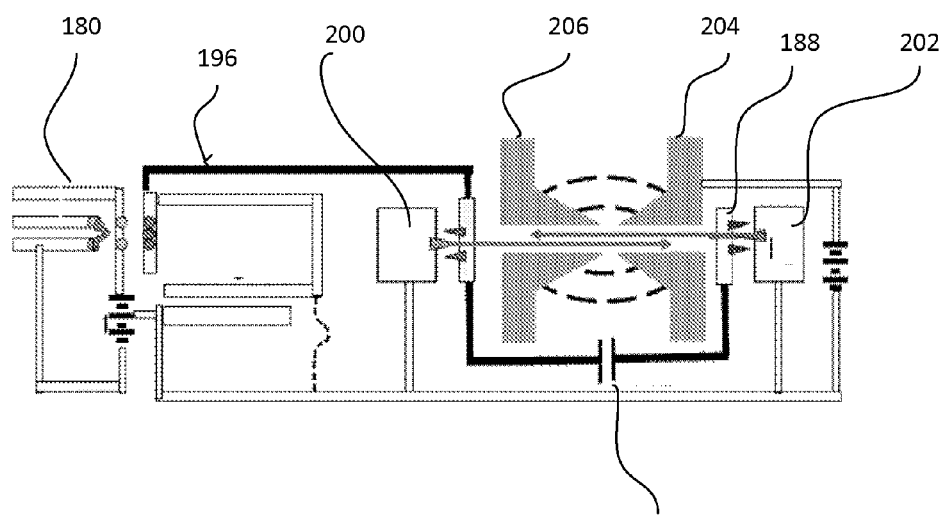
FIG. 12a a schematic circuit layout for the three components of a Miniaturized Dynatron Oscillator Tera-Hertz-Source with a Dynatron Oscillator for THz voltage oscillations, built as a serial resonator, with two triode electron sources.

The setting mentioned in FIG. 12a may be embedded in a housing analogue to FIG. 5 to FIG. 9.

LIST OF REFERENCE SIGNS 10 miniaturized device
12 emitter cathode
14 grid
16 anode
18 inductance
20 capacitor
22 dynatron tube
24 battery
26 oscillator
28 voltage connecting point
30 working point
32 voltage pickup
40 device
42 EBID-emitter
44 extractor grid
46 anode
47 oscillator
48 inductivity
50 capacitor
52 battery
54 primary electron beam
56 second electron beam
58 beam source
60 Miniaturized Dynatron Oscillator Tera-Hertz-Source
62 emitter tips
64 extractor rods
66 oscillator circuit
68 extractor
70 anode
72 cathode
74 focusing lens
76 emitter tip
78 primary electron beam
80 cavity resonator
82 extractor grid
84 anode
86 cavity
88 insulating substrate
90 base material
92 pumping cell wall
94 cavity resonator
96 electron source
97 extractor grid
98 cavity
99 Dynatron tube
100 central base
102 anode
104 focusing lenses
105 THz Emitter Cell
106 pumping cell wall
108 getter material
110 cavity
112 mirror
114 focusing lens
120 base
122 insulating resonator bottom
124 metal edge emitter
126 cylinder lens structure
128 focusing lens
130 Dynatron tube
132 anode
134 cavity resonator
136 oscillator
140 base
142 hole
150 Dynatron Source
152 frame
153 base plate
154 lever
156 moving one wall
158 anode
160 wires
164 spring
166 block
168 axis
170 pull rod
172 resonator wall
174 cathode assembly
180 dynatron tube
182 free beam triodes
184 free beam triode
186 extractor grid
188 extractor grid
190 free electron beam
192 free electron beam
194 capacitor
196 oscillator
200 cathode
202 cathode
204 anode
206 anode
208 stage amplifier
210 aperture

The invention claimed is:

1. Device (10, 40, 60, 105, 150) for generating electromagnetic THz radiation with free electron beams (54, 56, 78, 190, 192), comprising:
an oscillator (26, 47, 66, 196) supplying an alternating oscillator voltage with a frequency from 0.1 THz to 10 THz, said frequency corresponds to a wavelength of 3000 µm to 30 µm;
a dynatron tube (22, 99, 130, 180);

said dynatron tube (22, 99, 130) comprises: an electron source (12, 58, 72, 76, 96, 124,); an extraction grid (14, 14, 68, 64, 82); and, an anode (16, 46, 70, 84, 102) preferably coated with a material composition for high secondary electron emission;

said dynatron tube (22, 99, 130, 180) is arranged in a vacuum;

a voltage supply (24, 52);

said dynatron tube (22, 99, 130, 180) is connected to said voltage supply (24, 52), said voltage supply providing an extractor voltage between said electron source (12, 58, 72, 76, 96, 124) and said extraction grid (14, 44, 20 68, 64, 82);

a voltage divider;

a work point voltage extracted from said voltage divider;

said work point voltage is combined with said oscillator voltage to supply an anode voltage;

said anode voltage is the potential difference between said electron source (12, 58, 72, 76, 96, 124) and said anode (16, 46, 70, 84, 102);

said anode voltage is lower than said extractor voltage;

said work point voltage extracted at a voltage where said anode current becomes zero;

said extraction grid (14, 44, 68, 64, 82) and said anode (16, 46, 70, 84, 102) of said dynatron tube (22, 99, 130, 180) are positioned in proximity to each other within a distance smaller than half of the wavelength of the electromagnetic radiation to be emitted;

said oscillator voltage accelerates a positive primary free electron beam from said electron source to said anode (16, 46, 70, 84, 102) in a first half of said voltage swing of said oscillator voltage, and, in a second half of said voltage swing of said oscillator voltage said primary free electron beam is accelerated such that it generates a secondary free electron beam at said anode that is emitted from said anode (16, 46, 70, 84, 102) to said extraction grid (14, 44, 68, 64, 82, 186, 188);

said secondary free electron beam has as a maximum value twice as many electrons as said primary free electron beam and therefore a charge flow in reverse direction to said primary electron beam results and, therefore, said alternating oscillator voltage leads to free electron beams flying in alternating directions, which emit electromagnetic radiation with a frequency from 0.1 THz to 10 THz;

a first triode structure (182) and a second triode structure (184);

said dynatron tube (22, 99, 130, 180) is connected to said first and second triode structures (182, 184);

said first triode structure (182) includes a first extraction grid (186) and said second triode structure (184) includes a second extraction grid (188);

said oscillator voltage is applied to said first extraction grid (186) of said first triode structure (182); said first extraction grid includes a first extraction voltage which matches said oscillator voltage;

a capacitor (194);

said first triode (182) and said second triode structure (184) are connected to said oscillator, said capacitor (194) interposed between said first extraction grid (186) of said first triode (182) and said second extraction grid (188) of said second triode structure (184);

said oscillator voltage is supplied to said second extraction grid (188) of said second triode structure; said second extraction grid includes a second extraction voltage which matches said oscillator voltage;

electrons are emitted as a first free triode electron beam (190) from said first triode structure (182) in a first half-wave of said oscillator voltage used as said extraction voltage supplied by said oscillator (196) of said dynatron;

said second triode structure (184) is connected to said oscillator (26, 47, 66, 194, 196) via a capacitor (194) which reverses said oscillator voltage controlling said emission of said second triode;

due to said capacitor (194) a second free triode electron beam (192) is emitted by said second triode structure (184) in a negative voltage drop of a second half wave of said oscillator voltage used as said extraction voltage in said second triode structure (184);

a resonator (204) is positioned within said triode structure (182);

a resonator (206) is positioned within said triode structure (184);

each of said resonators (204, 206) comprise at least one hole that allows traveling of said free triode electron beams through said resonator (204, 206);

each of said resonators (204, 206) of said triodes are embodied as anodes; and, each of said anode voltages is higher than said respective triode extractor voltages.

2. Device according to claim 1, wherein said triode structures (182, 184) are placed oppositely with respect to each other and send electron beams in opposite directions.

3. Device (10, 40, 60, 105, 150) for generating electromagnetic THz radiation with free electron beams (54, 56, 78, 190, 192), comprising:

an oscillator (26, 47, 66, 194, 196) supplying an alternating oscillator voltage with a frequency from 0.1 THz to 10 THz, said frequency corresponds to a wavelength of 3000 μm to 30 μm;

a dynatron tube (22, 99, 130, 180), said dynatron tube (22, 99, 130, 180) comprises: an electron source (12, 58, 72, 76, 96, 124); an extraction grid (14, 44, 68, 64, 82) and, an anode (16, 46, 70, 84, 102) preferably coated with a material composition for high secondary electron emission;

said dynatron tube (22, 99, 130, 180) is arranged in a vacuum;

a voltage supply (24, 52);

said dynatron tube (22, 99, 130, 180) is connected to said voltage supply (24, 52), said voltage supply providing an extractor voltage between said electron source (12, 58, 72, 76, 96, 124) and said extraction grid (14, 44, 68, 64, 82);

a voltage divider;

a work point voltage is extracted from said voltage divider;

said work point voltage is combined with said oscillator voltage to supply an anode voltage;

said anode voltage is the potential difference between said electron source (12, 58, 72, 76, 96, 124) and said anode (16, 46, 70, 84, 102);

said anode voltage is lower than said extractor voltage;

said work point voltage is extracted at a voltage where said anode current becomes zero;

said extraction grid (14, 44, 68, 64, 82) and said anode (16, 46, 70, 84, 102) of said dynatron tube (22, 99, 130, 180) are positioned in proximity to each other within a distance smaller than half of the wavelength of the electromagnetic radiation emitted;

said oscillator voltage accelerates a positive primary free electron beam from said electron source (12, 58, 72, 76, 96, 124) to said anode (16, 46, 70, 84, 102) in a first half of said voltage swing of said oscillator voltage, and, in a second half of said voltage swing of said oscillator voltage said primary free electron beam is accelerated such that it generates a secondary free electron beam at said anode (16, 46, 70, 84, 102) that is emitted from said anode (16, 46, 70, 84, 102) to said extraction grid (14, 44, 68, 64, 82, 186, 188); and, said secondary free electron beam has as a maximum value twice as many electrons as said primary free electron beam and therefore a charge flow in reverse direction to said primary electron beam results and, therefore, said alternating oscillator voltage leads to free electron beams flying in alternating directions, which emit electromagnetic radiation with a frequency from 0.1 THz to 10 THz.

4. Device according to claim 1, wherein said device is fabricated in a miniaturized way, and wherein at least said dynatron tube (22, 99, 130, 180) and said oscillator (26, 47, 66, 194, 196) are fabricated as micro- or nanostructures.

5. Device according to claim 1, wherein said oscillator (26) is formed as a tuneable complex resistor comprising a resistor, an inductor (18, 48) and a capacitor (20, 50), with said capacitor (20, 50) and/or said inductor (18, 48) being tuneable.

6. Device according to claim 2, wherein said Dynatron tube (22, 99, 130, 180) is embodied as a microstructure integrated on an insulator (88, 122, 140, 153) with a heated or a cold electron source (12, 58, 72, 76, 96, 124, 200, 202).

7. Device according to claim 1, wherein said electron source is a cold field emission emitter in the form of a wire with a tip (76) of less than 1 µm tip radius.

8. Device according to claim 7, wherein:
said electron source is fabricated as a micro-nanostructure field emitter;
a material is deposited on the tip of the field emitter, having a low work function and emits electrons at least in response to said extraction voltage.

9. Device according to claim 1, wherein said source is fabricated as micro- or nanostructure and is constructed in form of a cold field electron edge emitter (124) from metal, or metal oxide, or carbon, or carbon compound, or other semiconductor material, or nano-granular compound material.

10. Device according to claim 1, further comprising: a controllable voltage source connected via at least one electrical terminal and connection to said electron source that is fabricated as micro- or nanostructured field emitter to stabilize radiation from said electron source (12, 58, 72, 76, 96, 124, 200, 202); and, said electron beam is emitted from at least one tip of a field emitter and is then collected on said anode.

11. Device according to claim 1, further comprising:
an at least electrically conducting housing having at least one radiation transmissive and vacuum tight lens and said dynatron tube (99, 130) is fabricated as micro- or nanostructure, and an oscillator (86, 136), which are surrounded by a conducting housing (80, 134) in rectangular form of a THz electromagnetic wave confining a cavity resonator, and, wherein said dimensions of said conducting housing are adapted to the frequency and wavelength of emitted radiation.

12. Device according to claim 1, further comprising:
at least electrically conducting housing having at least one radiation transmissive and vacuum tight lens (74, 99, 98, 104,128); and,
two Dynatron tube structures (99, 130) that are fabricated as micro- or nanostructure and oscillators which are built on top and on the bottom of an insulating base which are centrally arranged in the conducting housing, and, having an open hole between said extraction grid and said anode.

13. Device according to claim 1, further comprising:
a pumping cell (92);
said pumping cell comprises a pumping device (108) that provides vacuum;
said pumping cell (92) is at least connected to said dynatron tube (22, 99, 130, 180) and particularly to a cavity resonator (94), where said pumping cell is connected to a volume though a grid or mesh structure (106), which reflects the electromagnetic radiation, but transmits the gas from at least said dynatron tube (22, 99, 130, 180) to said pumping cell (92).

14. Device according to claim 1, further comprising:
a pumping device;
said pumping device is a conventional high vacuum pumping system, and/or a miniaturized vacuum pump that is producing high vacuum, for example, a miniaturized Orbitron pump and/or deposited getter materials (108).

15. Device according to claim 1, further comprising:
a THz Emitter Cell (105) with THz-radiation emitted out of both sides of the THz Emitter Cell (105);
said THz Emitter Cell (105) is using THz radiation mirrors (112) inclined with respect to the direction of the emitted radiation, e.g., in the form of fine metal mesh areas to direct the radiation in a parallel direction; and,
said THz emitter cell uses at least one THz radiation focusing lens (114) to supply radiation in a focused manner to an object.

16. Device according to claim 1, further comprising a resonator with at least four walls, where the emitted wavelength is tuneable, and where at least one wall (156) and at least one anode (158) is moveable to tune said device, and, where said anode is positioned in a static distance to the corresponding wall.

17. Device according to claim 5, further comprising:
said tuneability is realized by said tuneable capacitor of said oscillator circuit, and due to the position of said resonator walls and of said anode;
said anode and at least one of said moveable resonator wall is connected to mechanical means like NiTiNOL-stages, that use currents in the NiTiNOL wires or Piezo-effect driven micro actuators to change the capacity of said oscillator, and to move said moveable resonator walls and said anode to define and to select the wavelength of said THz radiation to be emitted.

18. Device according to claim 14, further comprising:
said tuneability is realized by said tuneable capacitor of said oscillator circuit, and due to the position of said resonator walls and of said anode;
said anode and at least one of said moveable resonator wall is connected to mechanical means like NiTiNOL-stages, that use currents in the NiTiNOL wires or Piezo-effect driven micro actuators to change the capacity of said oscillator, and to move said moveable resonator walls and said anode to define and to select the wavelength of said THz radiation to be emitted.

19. Usage of a device as claimed in claim 1 for generating electromagnetic radiation at THz frequency.

20. Device according to claim 3, wherein said Dynatron tube (22, 99, 130, 180) is embodied as a microstructure integrated on an insulator (88, 122, 140, 153) with a heated or a cold electron source (12, 58, 72, 76, 96, 124, 200, 202).

* * * * *